United States Patent [19]

Harari et al.

[11] Patent Number: 5,991,517
[45] Date of Patent: *Nov. 23, 1999

[54] FLASH EEPROM SYSTEM WITH CELL BY CELL PROGRAMMING VERIFICATION

[75] Inventors: Eliyahou Harari, Los Gatos; Robert D. Norman, San Jose; Sanjay Mehrotra, Milpitas, all of Calif.

[73] Assignee: SanDisk Corporation, Sunnyvale, Calif.

[*] Notice: This patent is subject to a terminal disclaimer.

[21] Appl. No.: 08/771,708

[22] Filed: Dec. 20, 1996

Related U.S. Application Data

[63] Continuation of application No. 08/174,768, Dec. 29, 1993, Pat. No. 5,602,987, which is a continuation of application No. 07/963,838, Oct. 20, 1992, Pat. No. 5,297,148, which is a division of application No. 07/337,566, Apr. 13, 1989, abandoned.

[51] Int. Cl.$^6$ .................................................... G06F 11/00
[52] U.S. Cl. ................................ 395/182.01; 395/182.06
[58] Field of Search ........................ 365/185.22, 185.19, 365/189.01, 226, 201; 395/182.06, 182.01

[56] References Cited

U.S. PATENT DOCUMENTS

| | | | |
|---|---|---|---|
| 4,090,258 | 5/1978 | Cricchi | 365/184 |
| 4,149,270 | 4/1979 | Cricchi et al. | 365/222 |

(List continued on next page.)

FOREIGN PATENT DOCUMENTS

| | | |
|---|---|---|
| 5931158 | of 1984 | Japan . |
| 62257699 | of 1987 | Japan . |
| 2061651 | of 1981 | United Kingdom . |

OTHER PUBLICATIONS

Torelli et al., "An improved method for programming a word–erasable EEprom," *Alta Frequenza*, vol. LII, No. 6, pp. 487–494, Nov.–Dec. 1983.

Torelli et al., "Single Chip, 16–Station TV Digital Tuning System," *SGS–ATES* Technical Note 170, pp. 1–19 (1984).

Torelli et al., "PLL2K–PLL Frequency Synthesizer For 30 Programs," *SGS–ATES Componenti Electronici SpA*, Technical Note 152, pp. 1–16 (1982).

Scroochi et al., "EPM32–Electronic Program Memory System For TV (32 Stations)," *SGS–ATES Componenti Electronici SpA*, Technical Note 153, pp. 1–19 (1982).

"EPM 16–Electronic Program Memory (16 Stations)," *SGS–ATES Componenti Electronici SpA*, MOS Integrated Circuits/M193A–M193C–M193D, 15 pps, (Nov., 1981).

"EPM–32 Electronic Program Memory (32 Stations)," *SGS–ATES Componenti Electronici SpA*, Mos Integrated Circuits/M293, 16 pps. (Oct., 1982).

(List continued on next page.)

*Primary Examiner*—Ly Hua
*Attorney, Agent, or Firm*—Majestic, Parsons, Siebert & Hsue

[57] ABSTRACT

A system of Flash EEprom memory chips with controlling circuits serves as non-volatile memory such as that provided by magnetic disk drives. Improvements include selective multiple sector erase, in which any combinations of Flash sectors may be erased together. Selective sectors among the selected combination may also be de-selected during the erase operation. Another improvement is the ability to remap and replace defective cells with substitute cells. The remapping is performed automatically as soon as a defective cell is detected. When the number of defects in a Flash sector becomes large, the whole sector is remapped. Yet another improvement individually verifies the states of a plurality of cells that are being programmed in parallel in order to terminate the programming, as a result of the verification, on a cell-by-cell basis as the cells reach their programmed states.

39 Claims, 22 Drawing Sheets

U.S. PATENT DOCUMENTS

| | | | |
|---|---|---|---|
| 4,181,980 | 1/1980 | McCoy | 365/185.45 |
| 4,253,059 | 2/1981 | Bell et al. | 371/21.4 |
| 4,272,830 | 6/1981 | Moench | 365/45 |
| 4,279,024 | 7/1981 | Schrenk | 365/185.22 |
| 4,287,570 | 9/1981 | Stark | 365/104 |
| 4,357,685 | 11/1982 | Daniels et al. | 365/185.22 |
| 4,393,475 | 7/1983 | Kitagawa et al. | 365/185.21 |
| 4,415,992 | 11/1983 | Adlhoch | 365/94 |
| 4,460,982 | 7/1984 | Gee et al. | 365/185.19 |
| 4,495,602 | 1/1985 | Sheppard | 365/104 |
| 4,586,163 | 4/1986 | Koike | 365/104 |
| 4,599,707 | 7/1986 | Fang | 35/185.02 |
| 4,612,629 | 9/1986 | Harari | 365/185.08 |
| 4,653,023 | 3/1987 | Suzuki et al. | 365/104 |
| 4,718,041 | 1/1988 | Baglee et al. | 365/185.22 |
| 4,733,394 | 3/1988 | Giebel | 371/21 |
| 4,752,929 | 6/1988 | Kantz et al. | 371/21.2 |
| 4,763,305 | 8/1988 | Kuo | 365/185.22 |
| 4,779,272 | 10/1988 | Kohda et al. | 365/185.2 |
| 4,799,195 | 1/1989 | Iwahashi et al. | 365/185.21 |
| 4,805,151 | 2/1989 | Terada et al. | 371/21.1 |
| 4,807,188 | 2/1989 | Casagrande | 3655/185.05 |
| 4,809,231 | 2/1989 | Shannon et al. | 365/201 |
| 4,811,294 | 3/1989 | Kobayashi et al. | 365/185.22 |
| 4,847,808 | 7/1989 | Kobatake | 365/104 |
| 4,870,618 | 9/1989 | Iwashita | 365/185.18 |
| 4,956,816 | 9/1990 | Atsumi et al. | 365/185.22 |
| 4,999,813 | 3/1991 | Ohtsuka et al. | 365/185.18 |
| 5,003,510 | 3/1991 | Hamisaki | 365/189.01 |
| 5,053,990 | 10/1991 | Kreifels et al. | 711/103 |
| 5,095,344 | 3/1992 | Harari et al. | 357/23.5 |
| 5,163,021 | 11/1992 | Mehrotra et al. | 365/185 |
| 5,172,338 | 12/1992 | Mehrotra et al. | 365/185 |
| 5,297,148 | 3/1994 | Harari et al. | 371/10.2 |
| 5,602,987 | 2/1997 | Harari et al. | 395/182.06 |

OTHER PUBLICATIONS

"Single Chip Non–Volatile Station Memory, PCM Remote Control Receiver and Display Driver," *SGS–ATES Componenti Electronici SpA,* MOS Integrated Circuits/M490–M491, 24 pps. (May, 1983).

"PLL TV Microcomputer Interface," *SGS–ATES Componenti Electronici SpA,* MOS Integrated Circuits/M290, 15 pps. (Jun., 1982).

Gee et al., "An Enhanced 16K E²PROM," *IEEE Journal of Solid State Circuits,* vol. SC–17, No. 5 (Oct. 1982).

Torelli, "An LSI technology fully compatible EAROM cell," *SGS–ATES Componenti Electronici SpA,* 7pp. (1982).

Caironi et al., "A TV Frequency Synthesis System With A Single Chip Microprocessor Interface Including Non Volatile Memory," *IEEE Transactions on Consumer Electronics,* vol. CE–28, No. 3, pp. 363–371 (Aug. 1982).

Torelli et al., "Integrating Non–Volatile Station Memory and Remote Control Receiver In A Single Chip," *IEEE Digest of Technical Papers,* Cat. No. 83CH1872–1, 2pp. (Jun., 1983).

Torelli et al., "Non–Volatile Station Memory Single Chip Including Remote Control Receiver and Memory Display Driver," *IEEE Transactions on Consumer Electronics,* vol. CE–29, No. 3, pp. 103–113 (Aug. 1983).

Excerpts from a 1983 Data Book published by SGS–ATES Group, 45 pp. (Nov. 1983).

Berenga et al., "E²–PROM TV Synthesizer," *IEEE Digest of Technical Papers,* Cat. No. 78CH1298–9SSC, 4 pp. (Feb. 1978).

Klingman, "Microprocessor Systems Design," *Prentice–Hall, Inc.,* pp. 30–31 (1977).

Masuoka et al., "A 256–kbit Flash E²PROM Using Triple––Polysilicon Technology," *IEEE Journal of Solid–State Circuits,* vol. SC–22, No. 4, (Aug. 1987).

Bleiker et al., "A Four–State EEPROM Using Floating–Gate Memory Cells," *IEEE Journal of Solid–State Circuits,* vol. SC–22, No. 3 (Jun., 1987).

Krick, P.J., "Three–State MNOS Fet Memory Array," *IBM Technical Disclosure Bulletin,* vol. 18, No. 12, pp. 4192–4193 (May, 1976).

Alberts, et al., "Multi–Bit Storage Fet EAROM Cell," *IBM Technical Disclosure Bulletin,* vol. 24, No. 7A, pp. 3311–3314 (Dec. 1981).

Stark, M., "Two Bits Per Cell Rom," *IEEE Catalog No. 81–CH1626–1,* Library of Congress No. 80–85186, Order No. 341, Spring Comp Con 1981, Feb. 23–26, Twenty–Second Computer Society International Conference, San Francisco, CA.

Furuyama et al., "An Experimental 2–Bit/Cell Storage Dram For Macro Cell or Memory–On–Logic Application," pp. 4.4.1–4.4.4, *IEEE,* (1988).

Horiguchi et al., "An Experimental Large–Capacity Semiconductor File Memory Using 16–Levels Cell Storage," *IEEE Journal Of Solid–State Circuits,* vol. 23, No. 1, Feb. 1988.

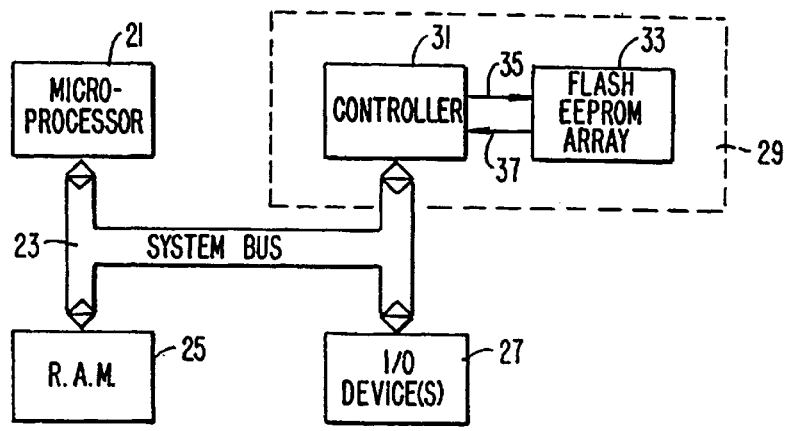
FIG._1A
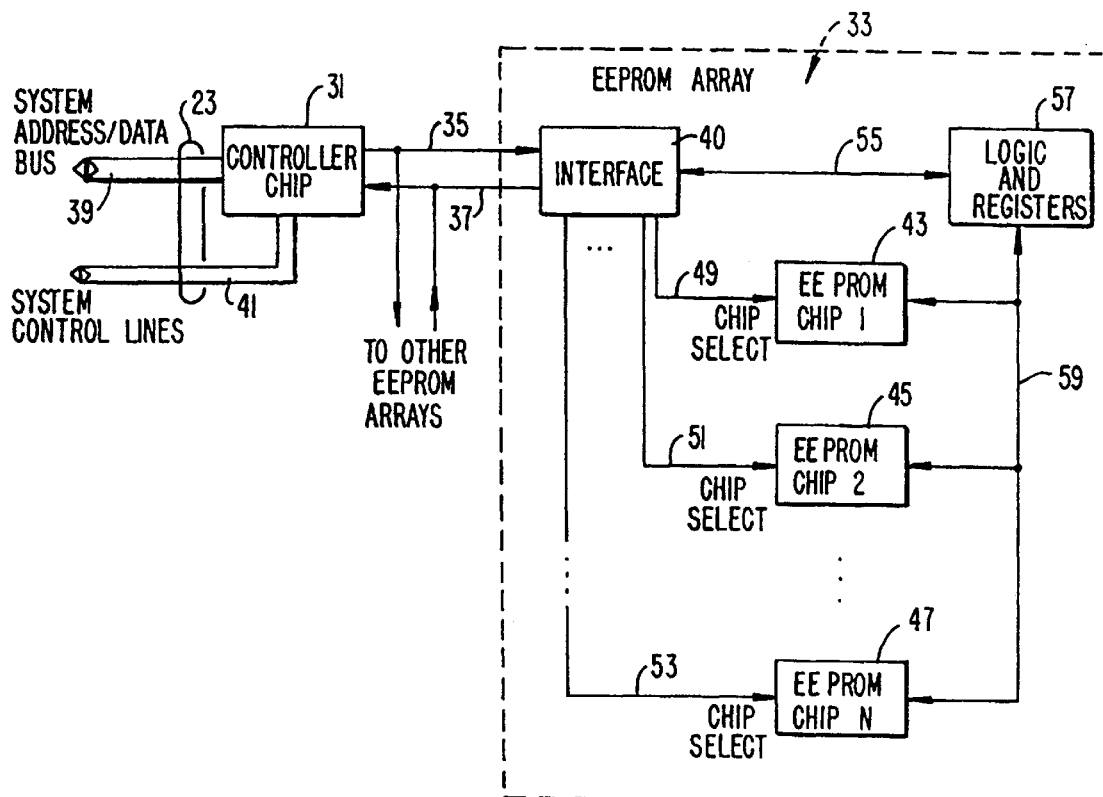
FIG._1B

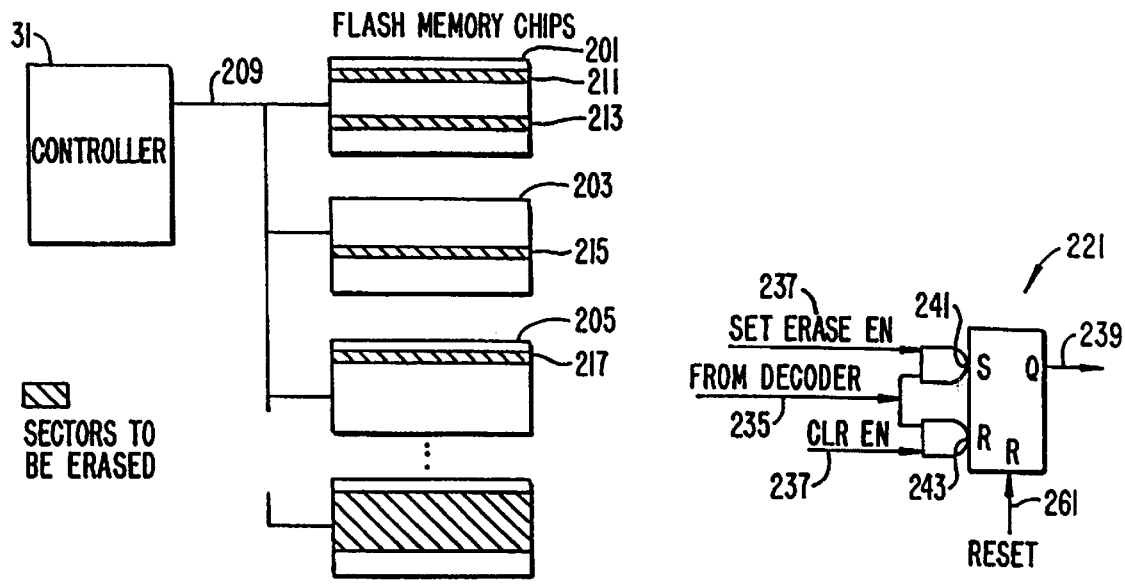
FIG._2  FIG._3B
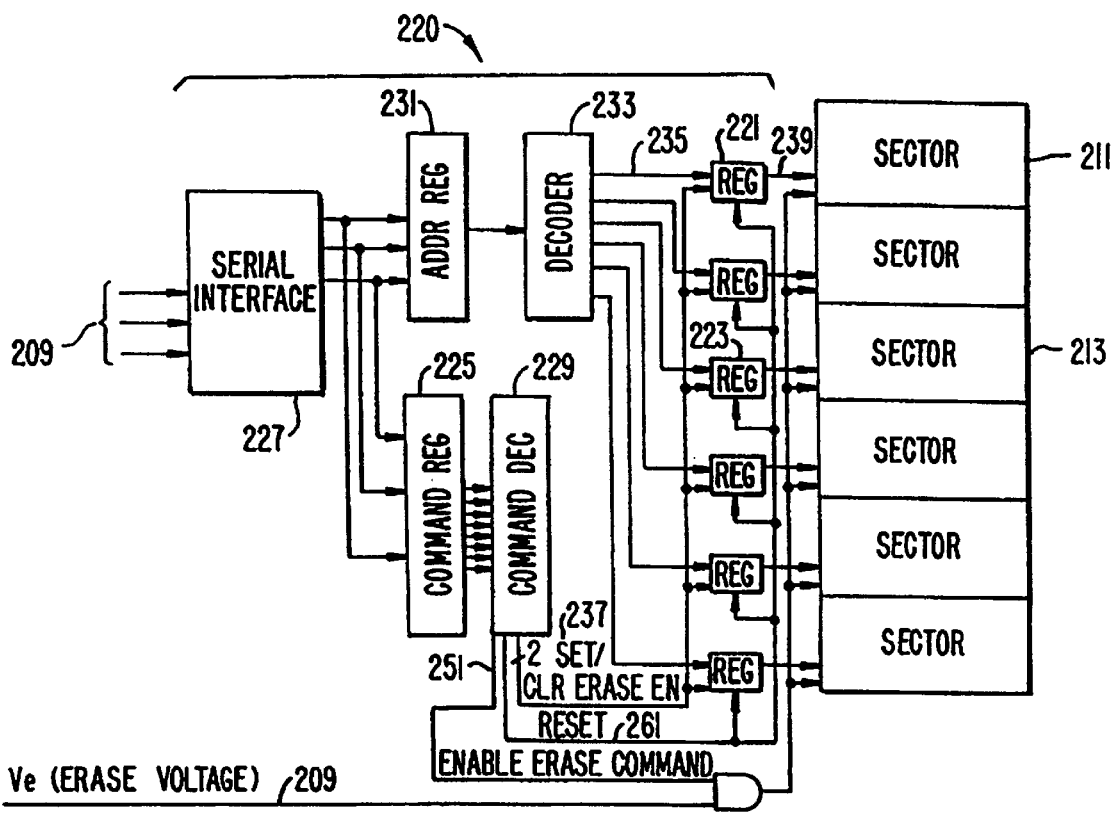
FIG._3A

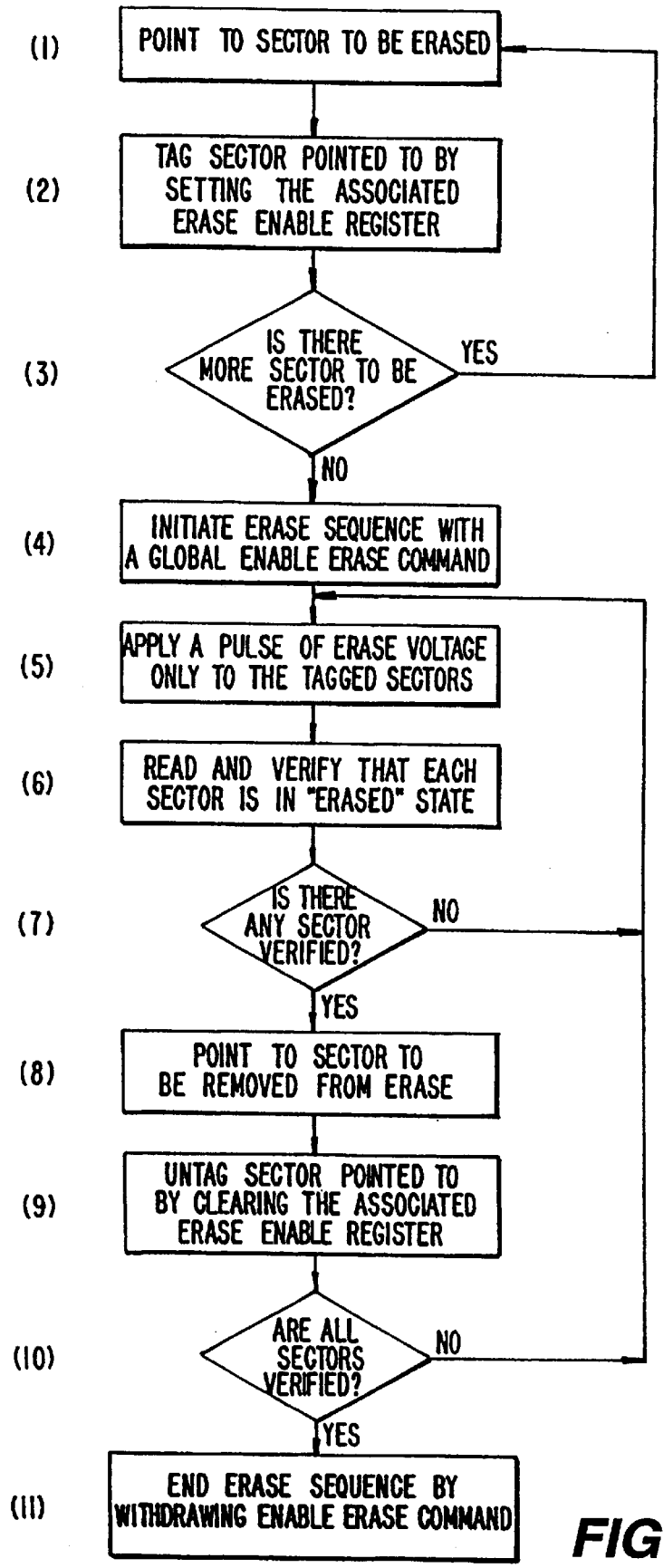
FIG._4

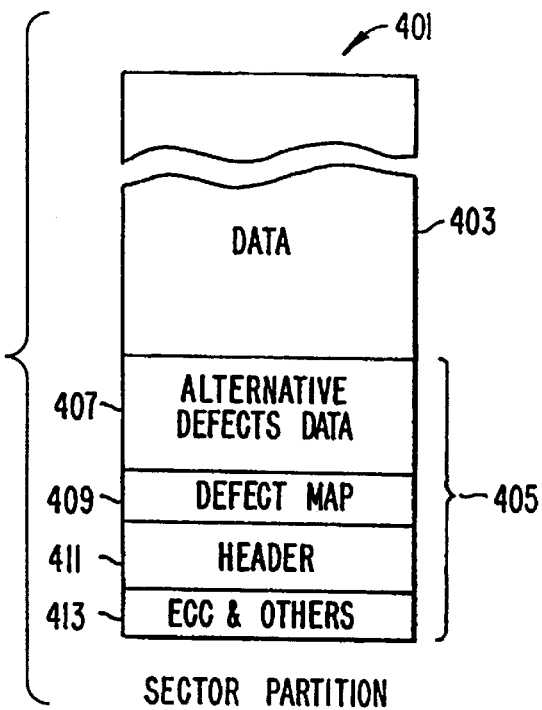
FIG._5
SECTOR PARTITION
READ DATA PATH CONTROL
FIG._6

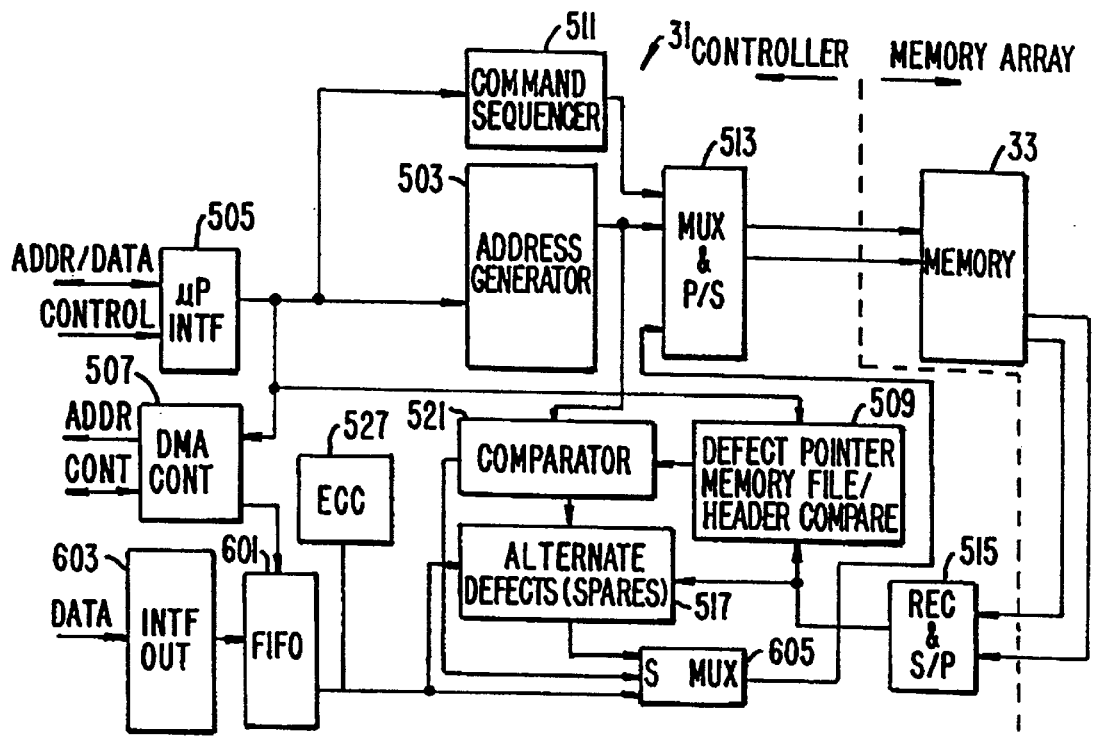
WRITE DATA PATH CONTROL
FIG._7
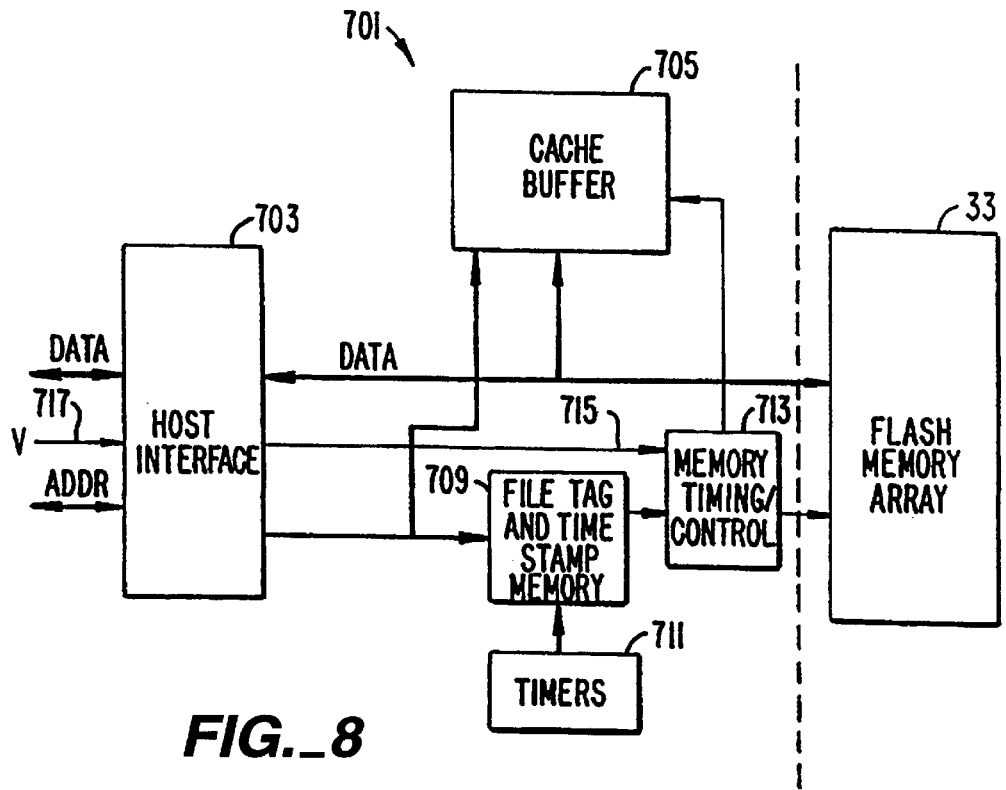
FIG._8

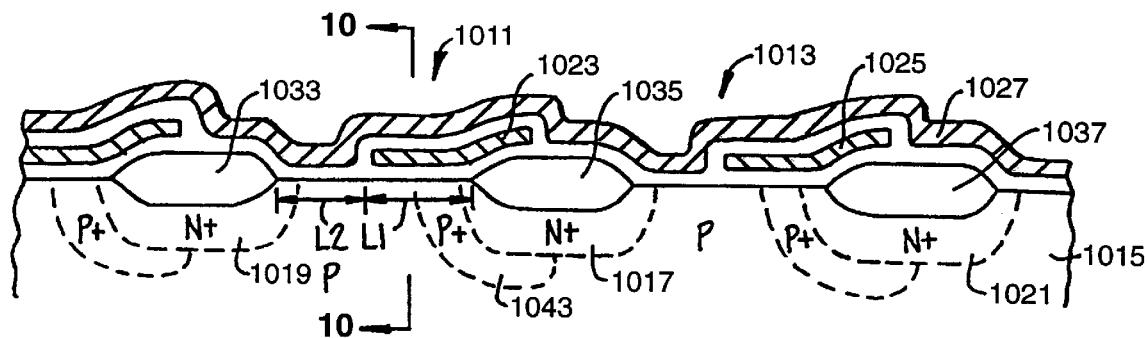
FIG._9
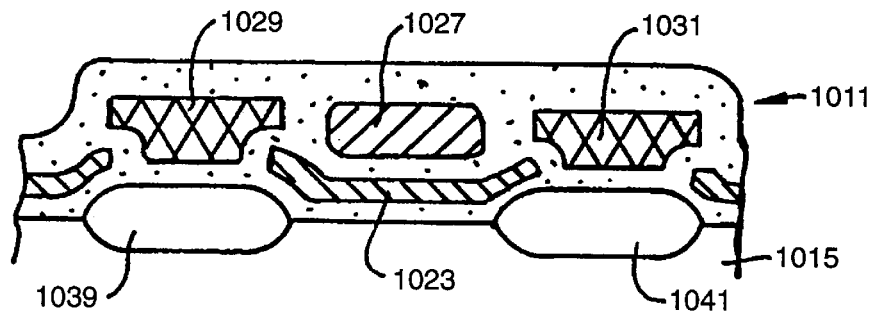
FIG._10
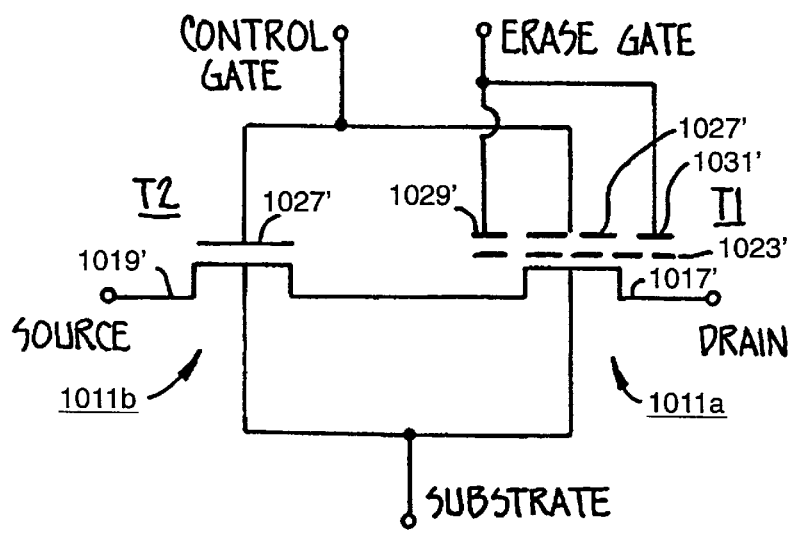
FIG._11

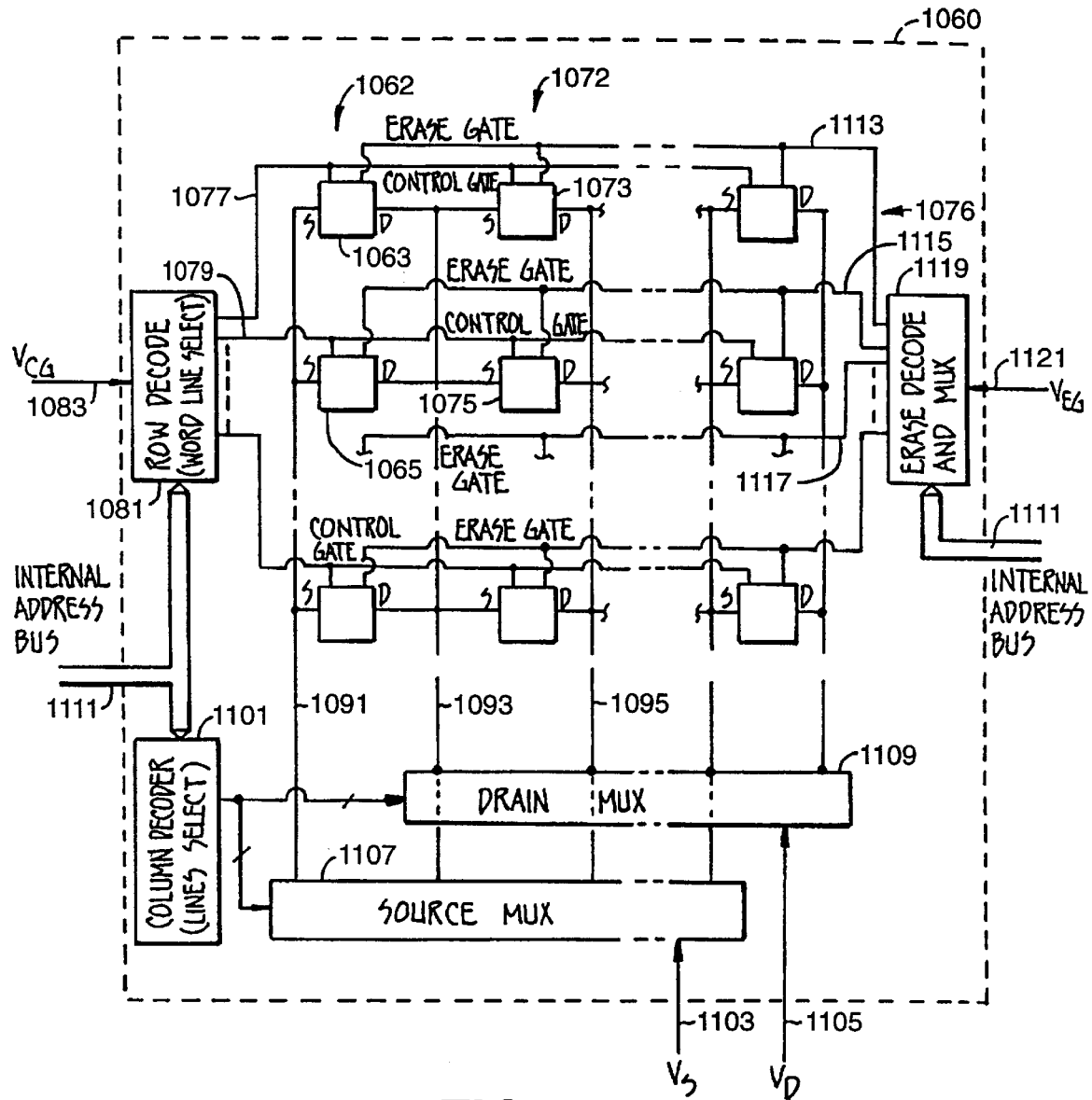
FIG._12

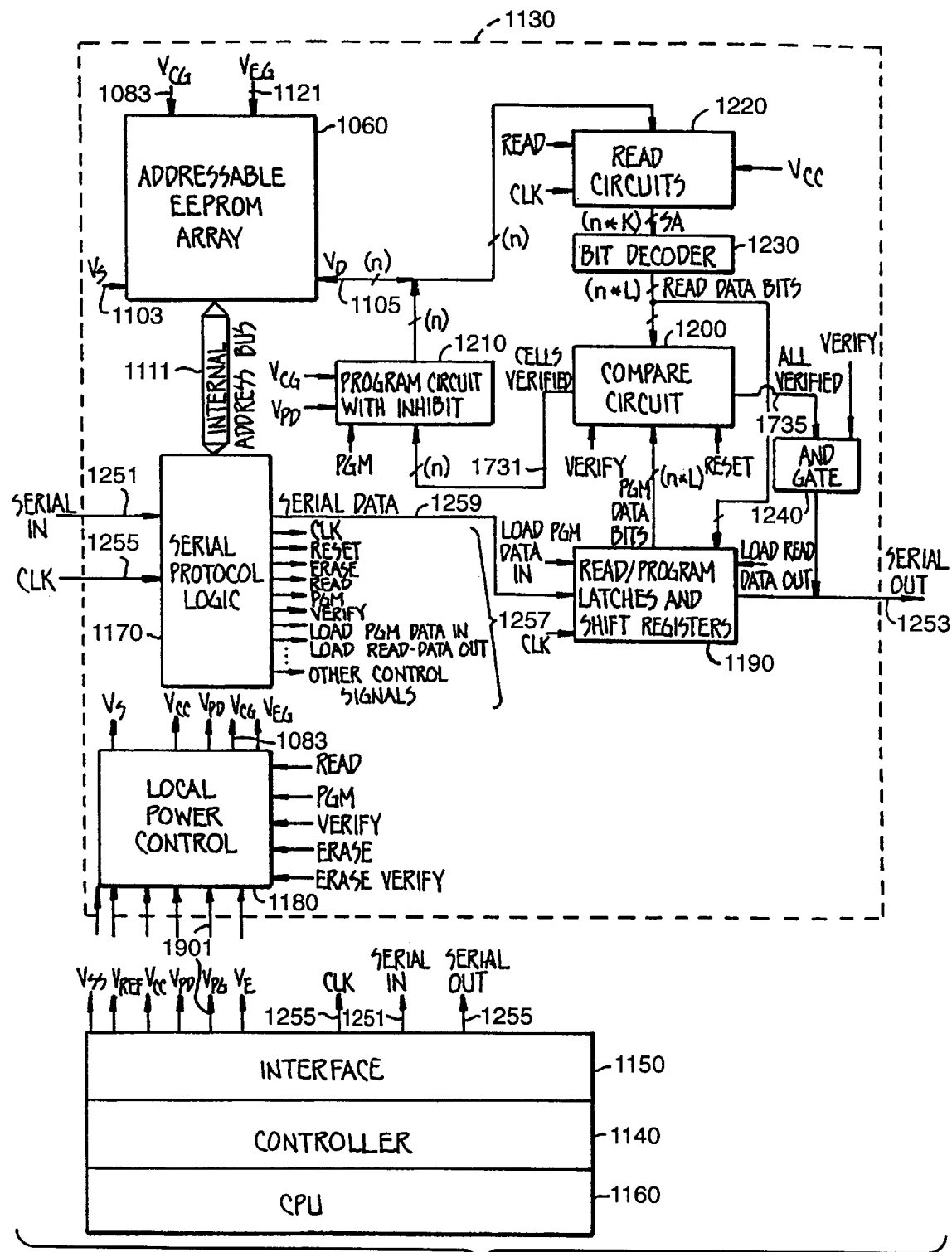
FIG._13

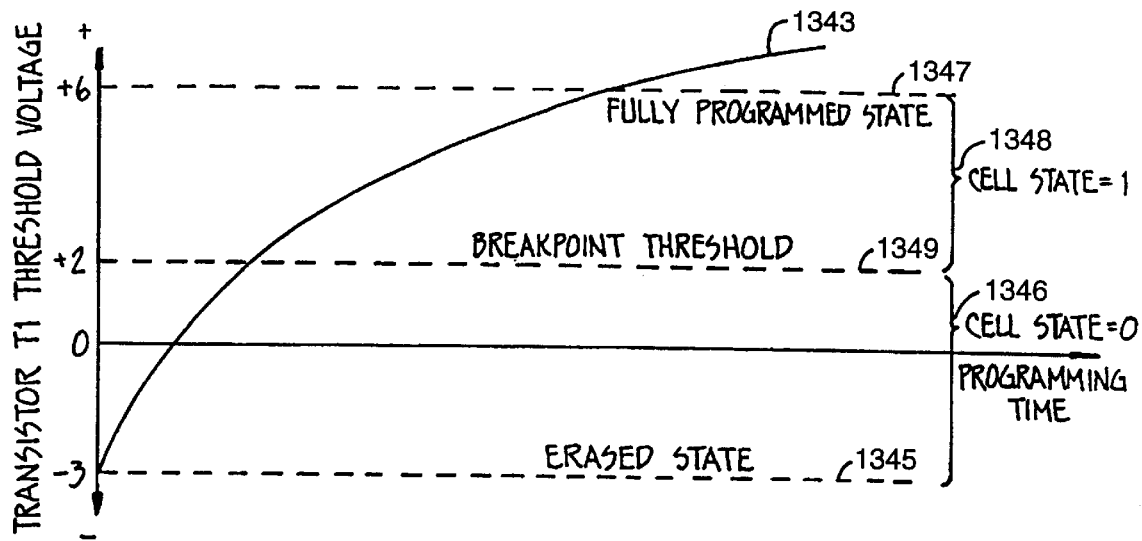
FIG._14
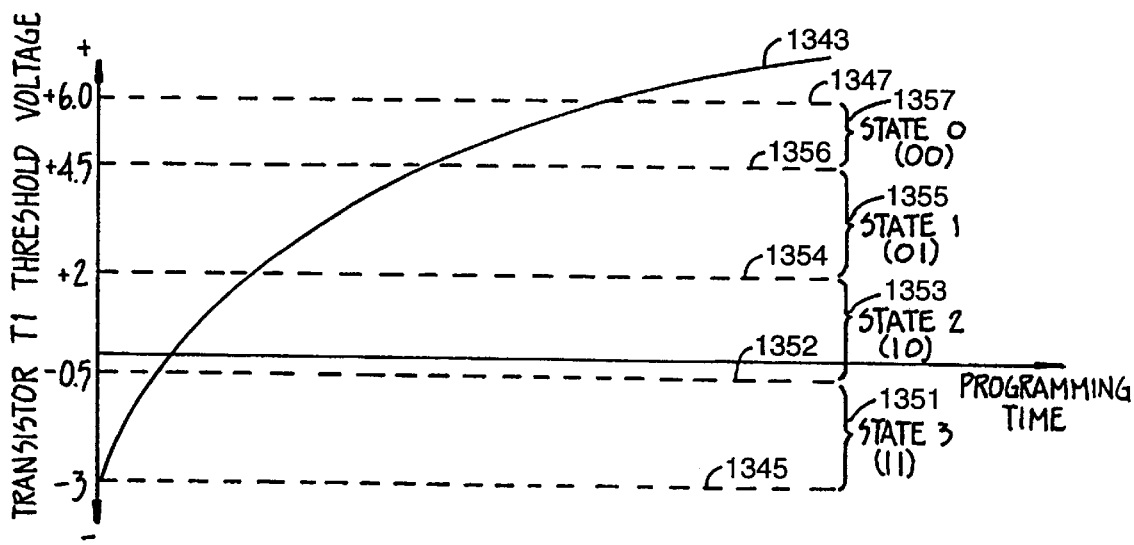
FIG._15A

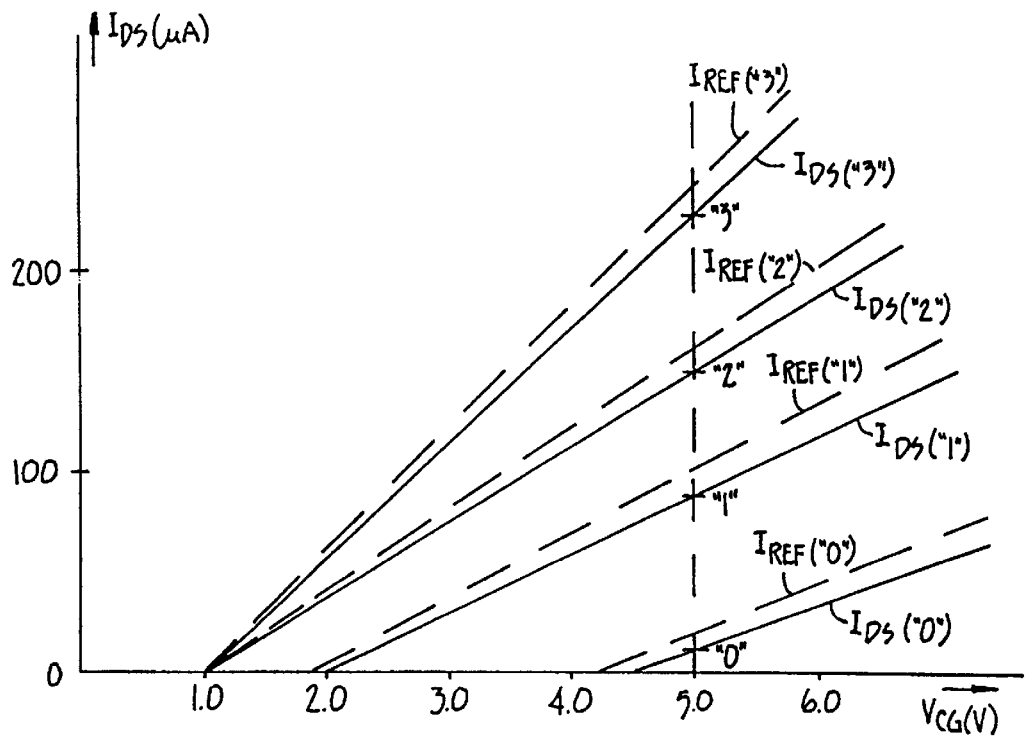
FIG._15B
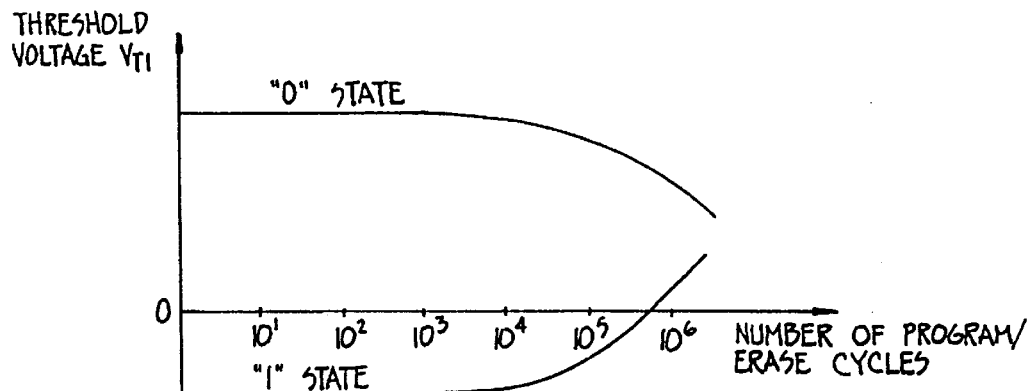
FIG._16A
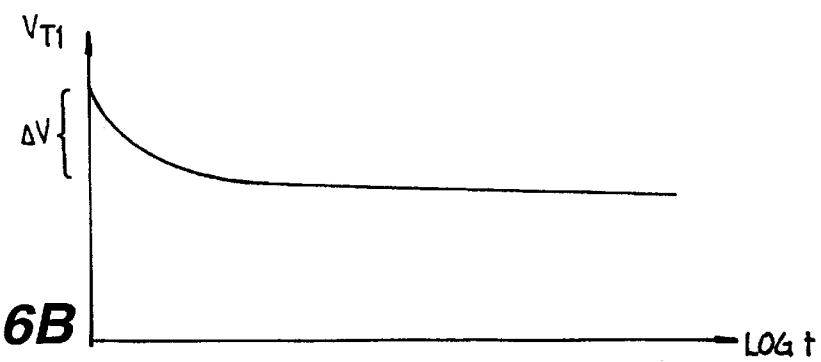
FIG._16B

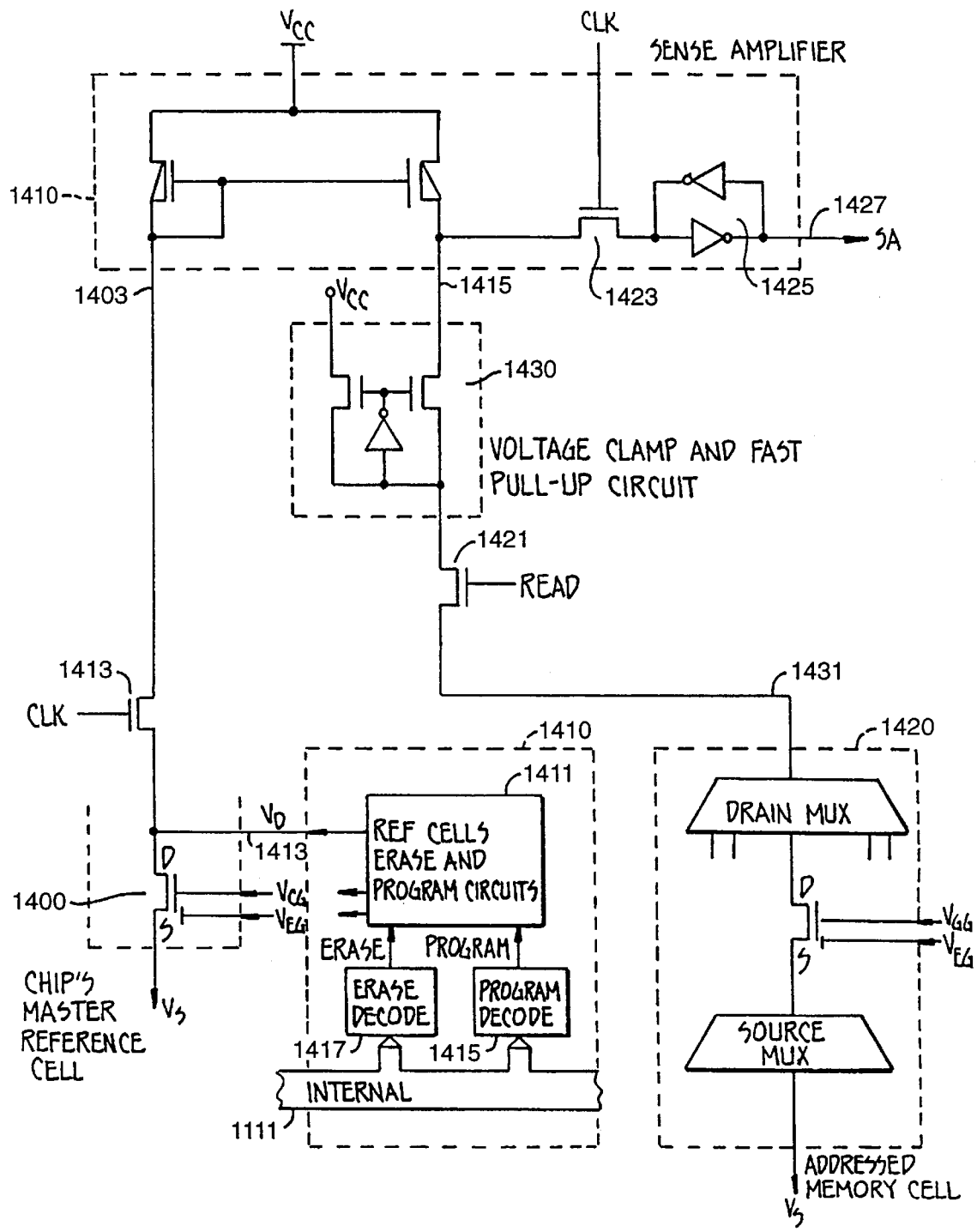
FIG._17A

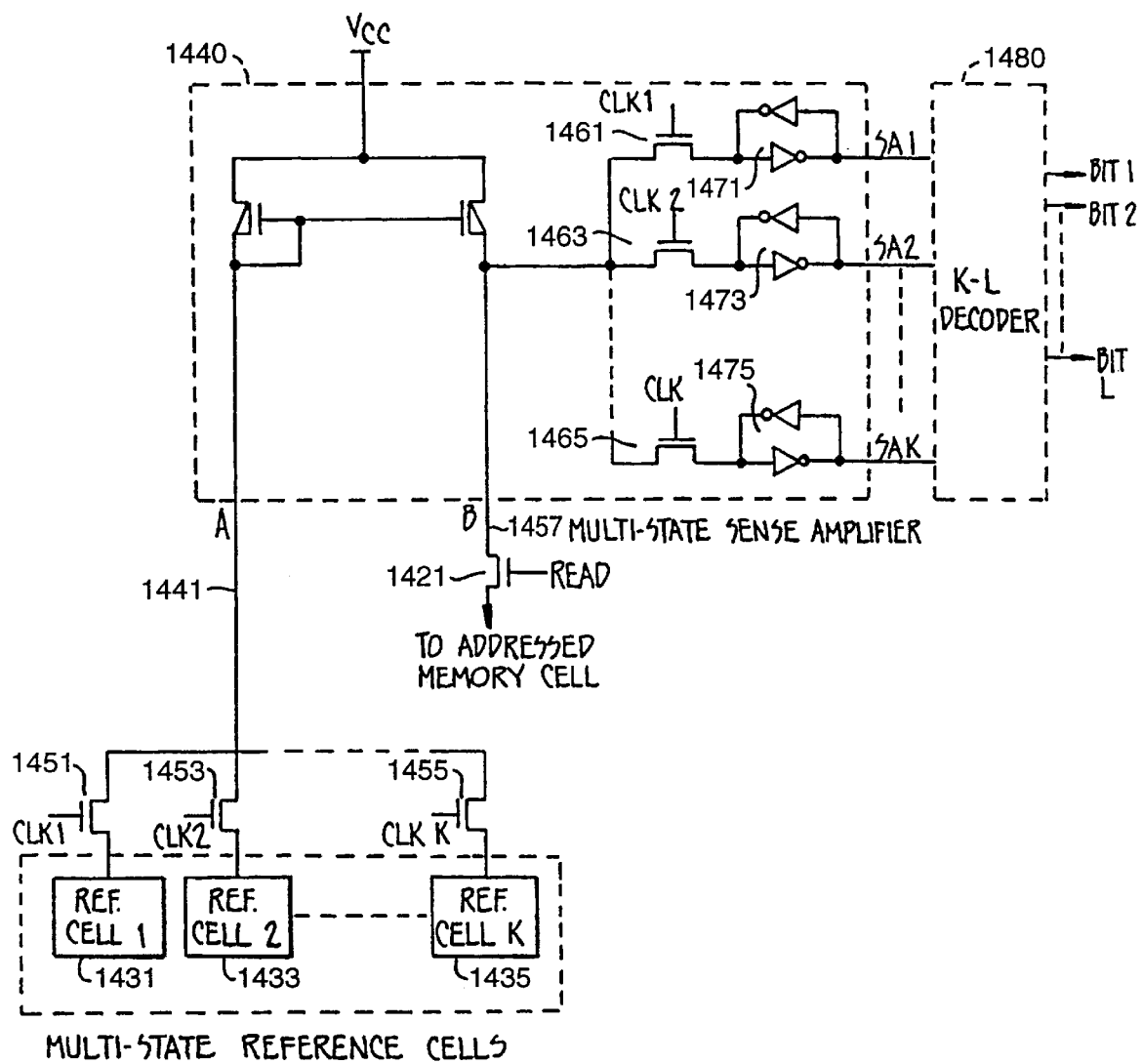
FIG._17B

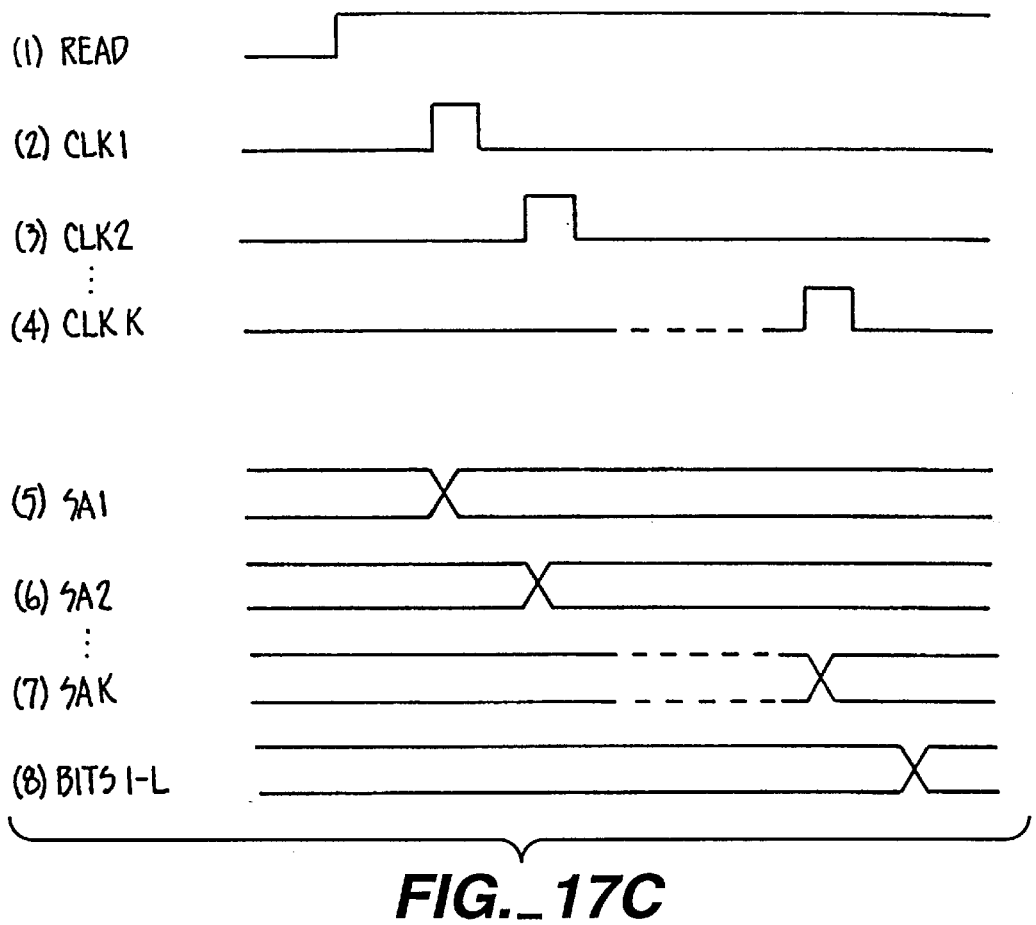
FIG._17C
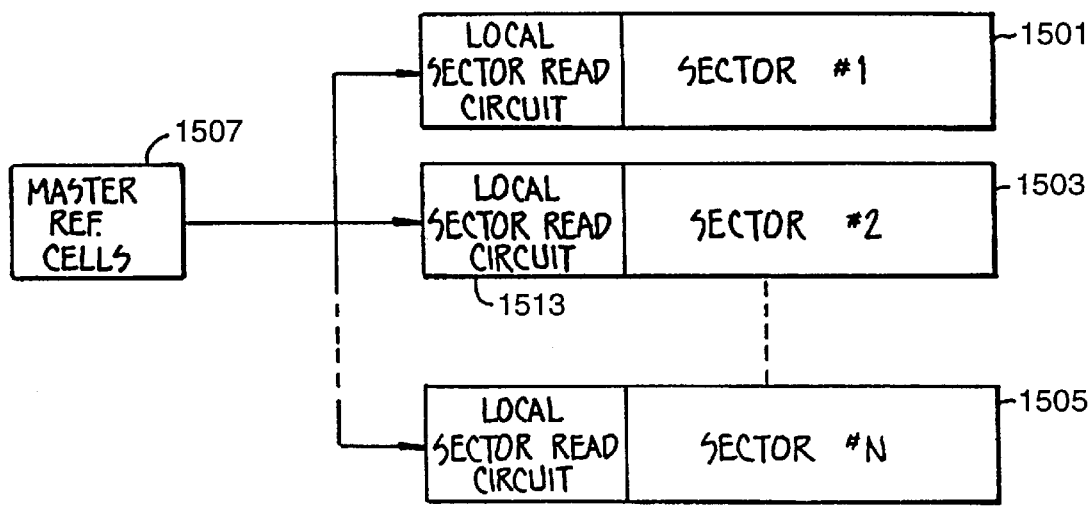
FIG._18

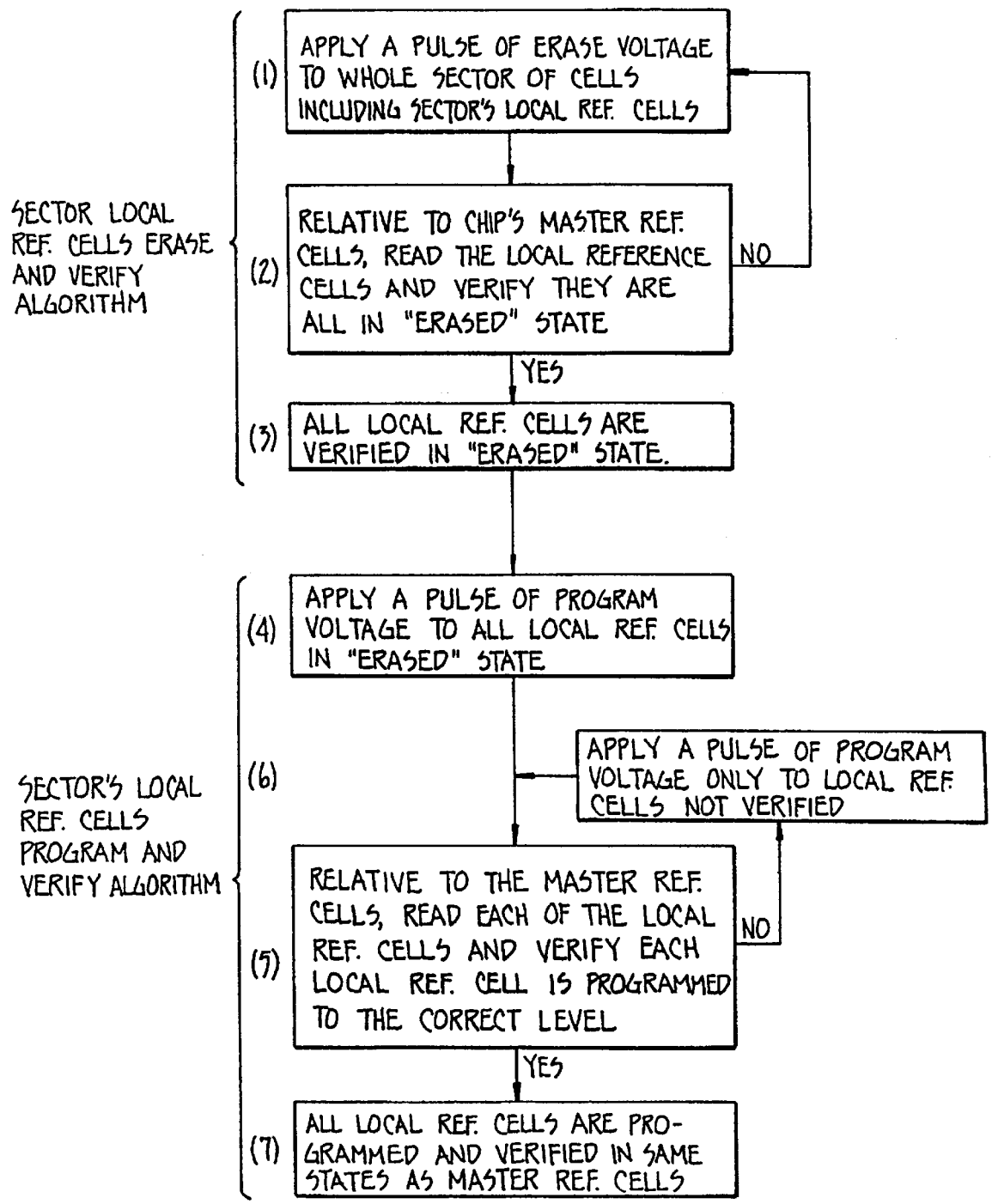
FIG._19

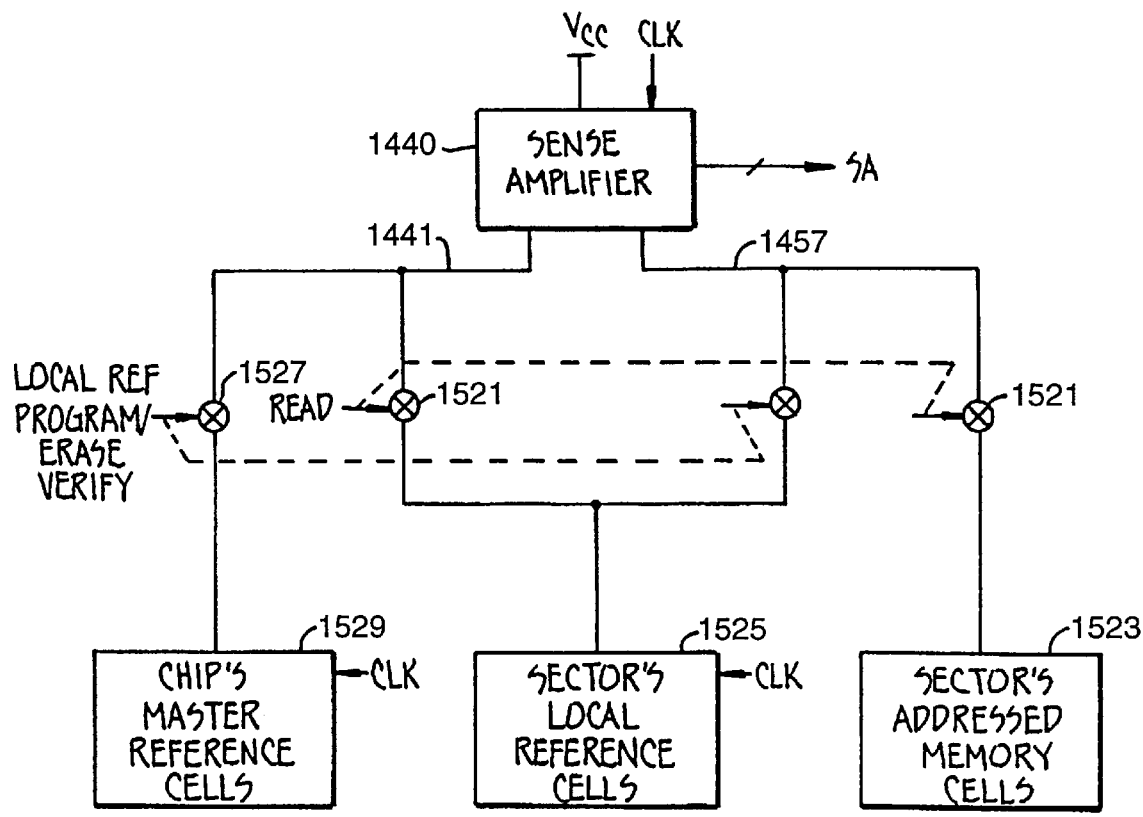
FIG._20A
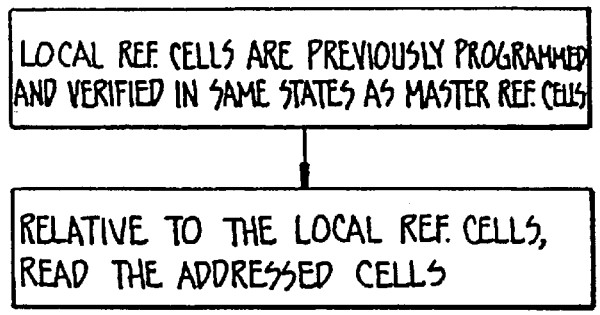
FIG._20B

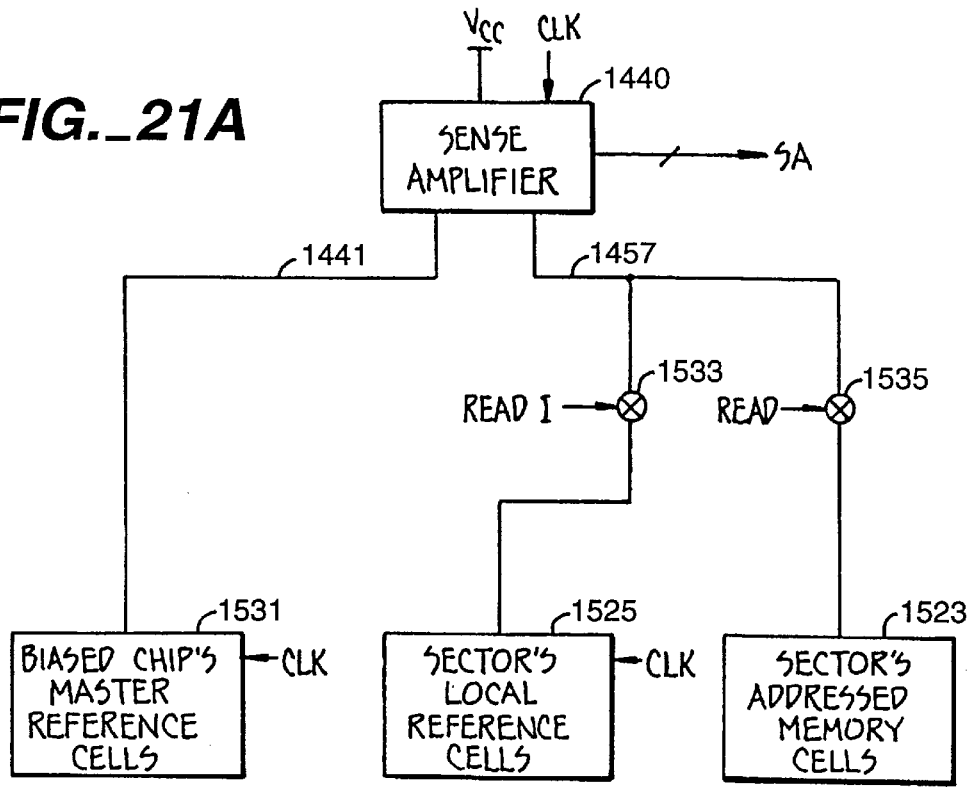

FIG._21A

| | |
|---|---|
| (1) | LOCAL REF. CELLS ARE PREVIOUSLY PROGRAMMED AND VERIFIED IN SAME STATES AS MASTER REF. CELLS |
| (2) | RELATIVE TO THE LOCAL REFERENCE CELLS READ THE MASTER REF. CELLS |
| (3) | DETERMINE THE DIFFERENCES, IF ANY AND BIAS. THE MASTER REF CELLS' CURRENTS SUCH THAT THE SAME READING IS OBTAINED RELATIVE TO THE BIASED MASTER REF. CELLS AS RELATIVE TO THE LOCAL REF. CELLS |
| (4) | RELATIVE TO THE BIASED MASTER REF. CELLS, READ THE ADDRESSED CELLS |

FIG._21D

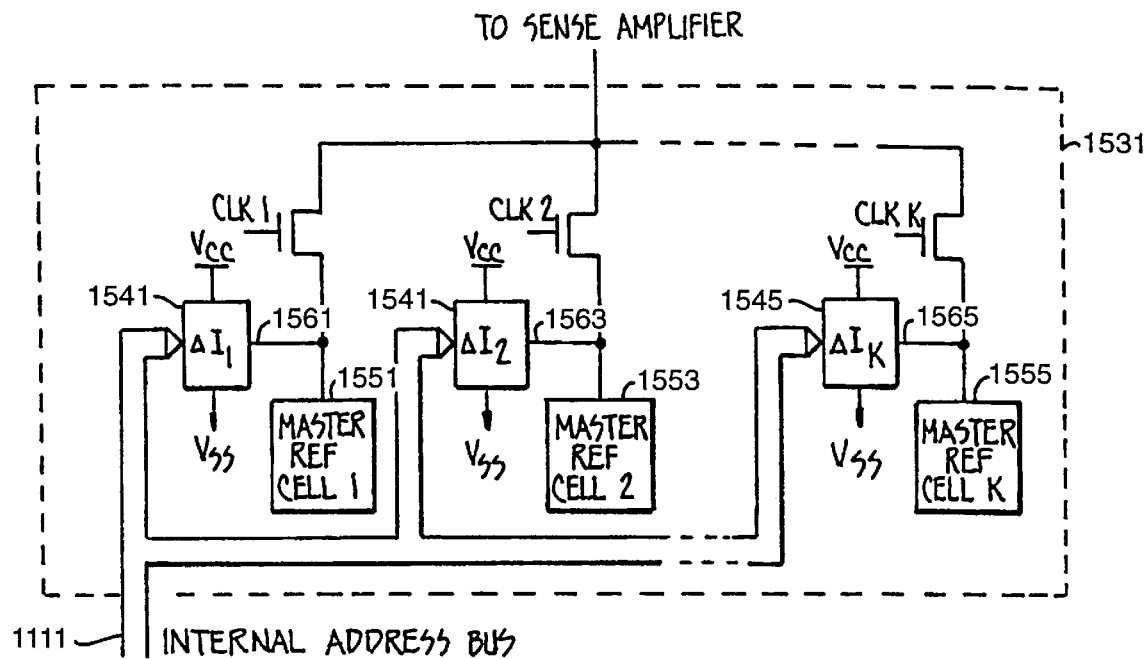
FIG._21B
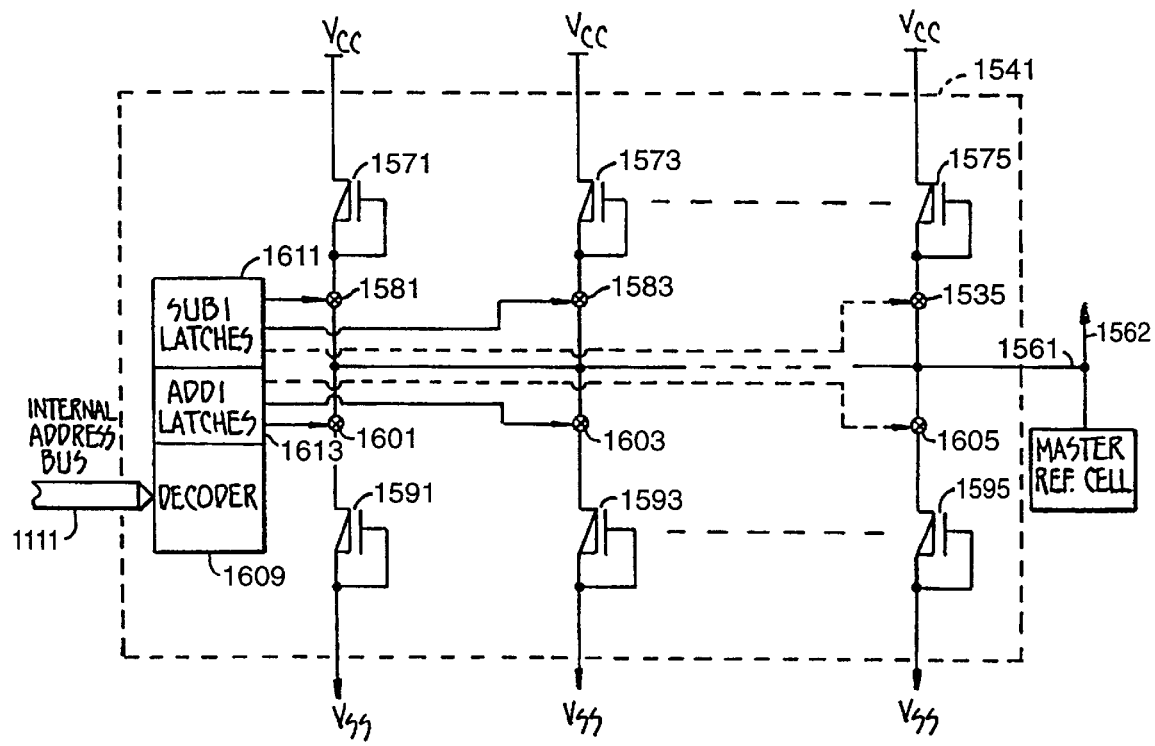
FIG._21C

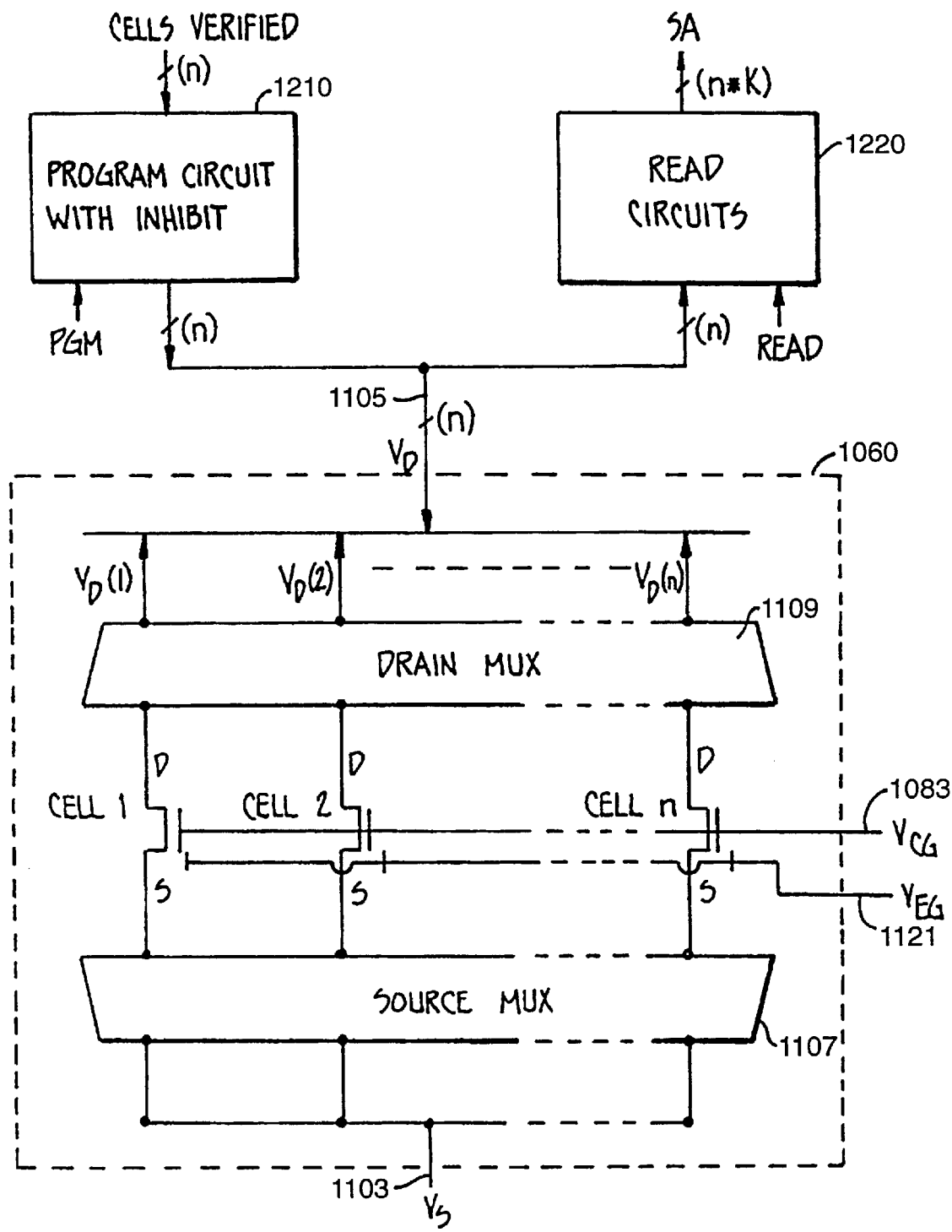
READ/PROGRAM DATA PATHS FOR n CELLS IN PARALLEL
*FIG._22*

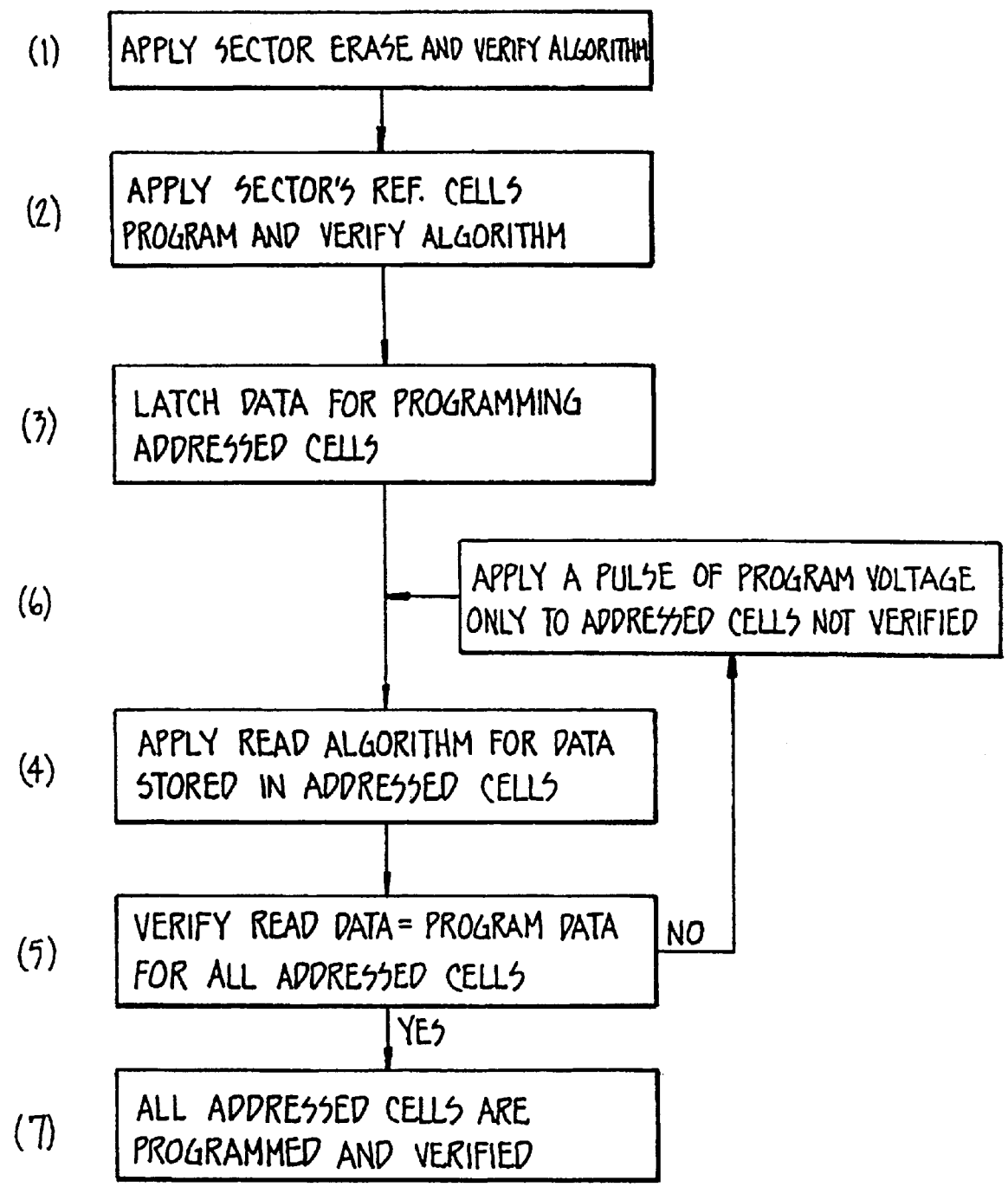
PROGRAM ALGORITHM
FIG._23

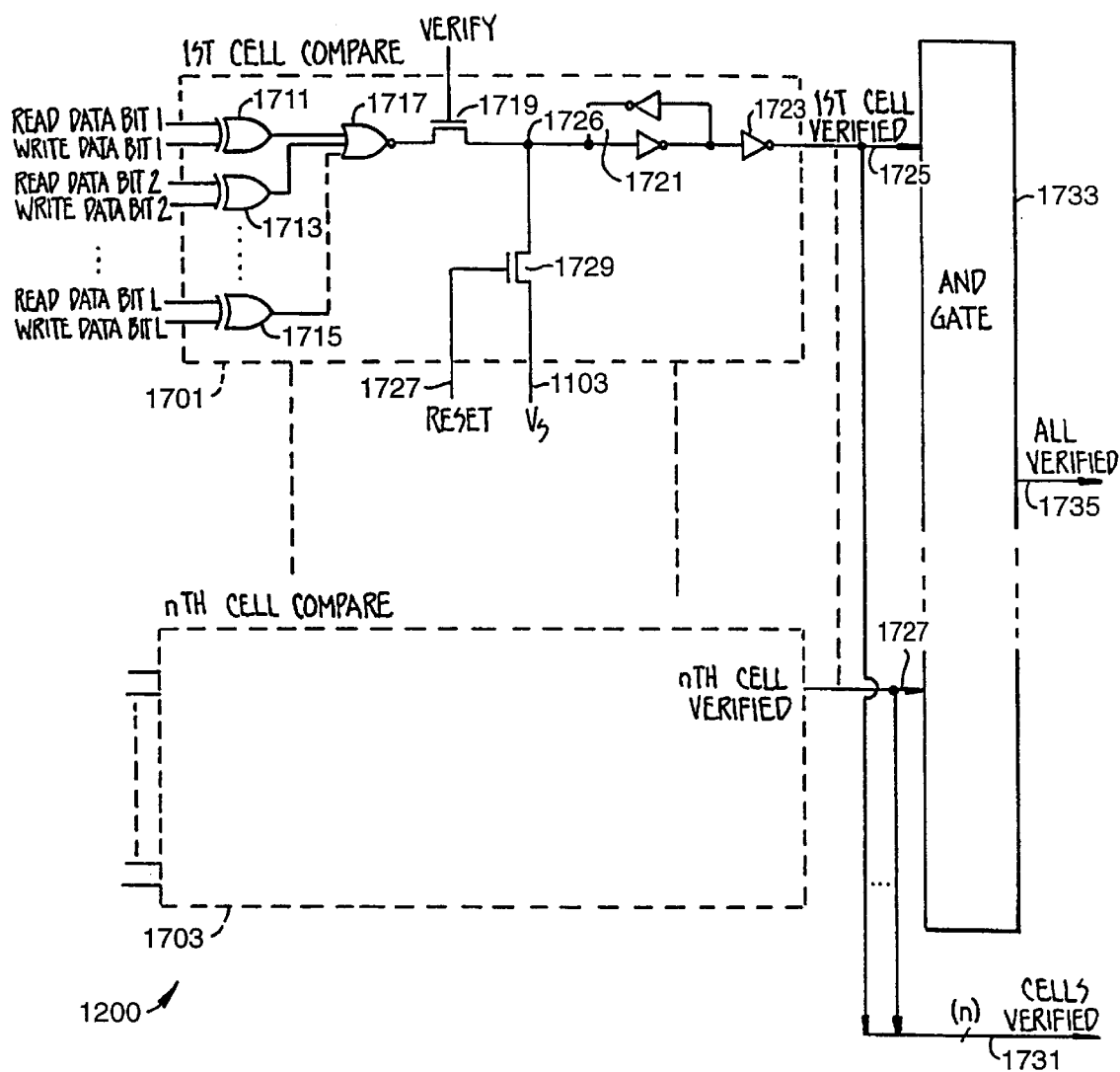
FIG._24

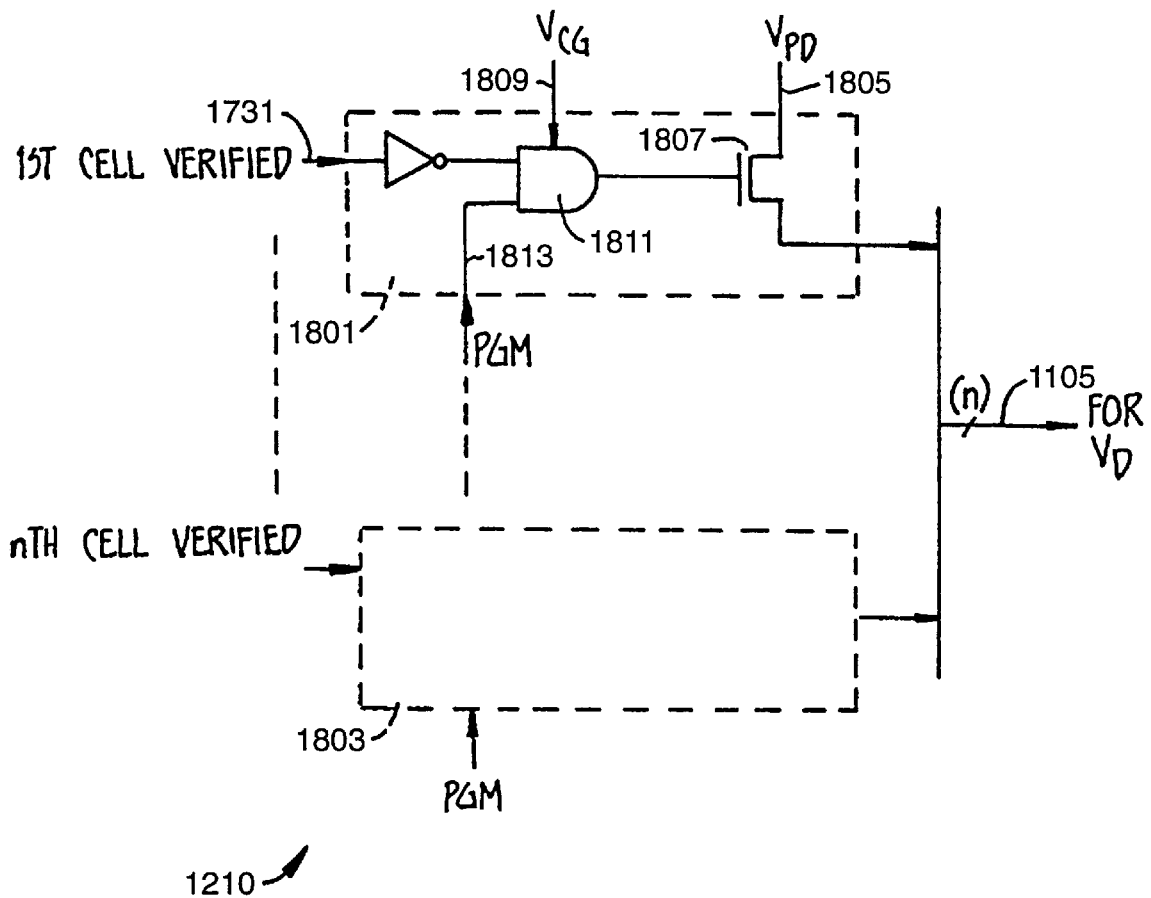
FIG._25

|  | SELECTED CONTROL GATE $V_{CG}$ | DRAIN $V_D$ | SOURCE $V_S$ | ERASE GATE $V_{EG}$ |
|---|---|---|---|---|
| READ | $V_{PG}$ | $V_{REF}$ | $V_{SS}$ | $V_E$ |
| PROGRAM | $V_{PG}$ | $V_{PD}$ | $V_{SS}$ | $V_E$ |
| PROGRAM VERIFY | $V_{PG}$ | $V_{REF}$ | $V_{SS}$ | $V_E$ |
| ERASE | $V_{PG}$ | $V_{REF}$ | $V_{SS}$ | $V_E$ |
| ERASE VERIFY | $V_{PG}$ | $V_{REF}$ | $V_{SS}$ | $V_E$ |

TABLE 1

FIG._26

| (TYPICAL VALUES) | READ | PROGRAM | PROGRAM VERIFY | ERASE | ERASE VERIFY |
|---|---|---|---|---|---|
| $V_{PG}$ | $V_{CC}$ | 12V | $V_{CC}+\delta V$ | $V_{CC}$ | $V_{CC}-\delta V$ |
| $V_{CC}$ | 5V | 5V | 5V | 5V | 5V |
| $V_{PD}$ | $V_{SS}$ | 8V | 8V | $V_{SS}$ | $V_{SS}$ |
| $V_E$ | $V_{SS}$ | $V_{SS}$ | $V_{SS}$ | 20V | $V_{SS}$ |
| UNSELECTED CONTROL GATE | $V_{SS}$ | $V_{SS}$ | $V_{SS}$ | $V_{SS}$ | $V_{SS}$ |
| UNSELECTED BIT LINE | $V_{REF}$ | $V_{REF}$ | $V_{REF}$ | $V_{REF}$ | $V_{REF}$ |

$V_{SS}=0V$, $V_{REF}=1.5V$, $\delta V=0.5V-1V$

TABLE 2

FIG._27

FLASH EEPROM SYSTEM WITH CELL BY CELL PROGRAMMING VERIFICATION

CROSS-REFERENCE TO RELATED APPLICATIONS

This is a continuation of patent application Ser. No. 08/174,768, filed Dec. 29, 1993, now U.S. Pat. No. 5,602,987 which in turn is a continuation of patent application Ser. No. 07/963,838, filed Oct. 20, 1992, now U.S. Pat. No. 5,297,148, which in turn is a division of patent application Ser. No. 07/337,566, filed Apr. 13, 1989, now abandoned.

BACKGROUND OF THE INVENTION

This invention relates generally to semiconductor electrically erasable programmable read only memories (EEprom), and specifically to a system of integrated circuit Flash EEprom chips.

Computer systems typically use magnetic disk drives for mass storage of data. However, disk drives are disadvantageous in that they are bulky and in their requirement for high precision moving mechanical parts. Consequently they are not rugged and are prone to reliability problems, as well as consuming significant amounts of power. Solid state memory devices such as DRAM's and SRAM's do not suffer from these disadvantages. However, they are much more expensive, and require constant power to maintain their memory (volatile). Consequently, they are typically used as temporary storage.

EEprom's and Flash EEprom's are also solid state memory devices. Moreover, they are nonvolatile, and retain their memory even after power is shut down. However, conventional Flash EEprom's have a limited lifetime in terms of the number of write (or program)/erase cycles they can endure. Typically the devices are rendered unreliable after $10^2$ to $10^3$ write/erase cycles. Traditionally, they are typically used in applications where semi-permanent storage of data or program is required but with a limited need for reprogramming.

Accordingly, it is an object of the present invention to provide a Flash EEprom memory system with enhanced performance and which remains reliable after enduring a large number of write/erase cycles.

It is another object of the present invention to provide an improved Flash EEprom system which can serve as non-volatile memory in a computer system.

It is another object of the present invention to provide an improved Flash EEprom system that can replace magnetic disk storage devices in computer systems.

It is another object of the present invention to provide a Flash EEprom system with improved erase operation.

It is another object of the present invention to provide a Flash EEprom system with improved error correction.

It is yet another object of the present invention to provide a Flash EEprom with improved write operation that minimizes stress to the Flash EEprom device.

It is still another object of the present invention to provide a Flash EEprom system with enhanced write operation.

SUMMARY OF THE INVENTION

These and additional objects are accomplished by improvements in the architecture of a system of EEprom chips, and the circuits and techniques therein.

According to one aspect of the present invention, an array of Flash EEprom cells on a chip is organized into sectors such that all cells within each sector are erasable at once. A Flash EEprom memory system comprises one or more Flash EEprom chips under the control of a controller. The invention allows any combination of sectors among the chips to be selected and then erased simultaneously. This is faster and more efficient than prior art schemes where all the sectors must be erased every time or only one sector at a time can be erased. The invention further allows any combination of sectors selected for erase to be deselected and prevented from further erasing during the erase operation. This feature is important for stopping those sectors that are first to be erased correctly to the "erased" state from over erasing, thereby preventing unnecessary stress to the Flash EEprom device. The invention also allows a global de-select of all sectors in the system so that no sectors are selected for erase. This global reset can quickly put the system back to its initial state ready for selecting the next combination of sectors for erase. Another feature of the invention is that the selection is independent of the chip select signal which enables a particular chip for read or write operation. Therefore it is possible to perform an erase operation on some of the Flash EEprom chips while read and write operations may be performed on other chips not involved in the erase operation.

According to another aspect of the invention, improved error correction circuits and techniques are used to correct for errors arising from defective Flash EEprom memory cells. One feature of the invention allows defect mapping at cell level in which a defective cell is replaced by a substitute cell from the same sector. The defect pointer which connects the address of the defective cell to that of the substitute cell is stored in a defect map. Every time the defective cell is accessed, its bad data is replaced by the good data from the substitute cell.

Another feature of the invention allows defect mapping at the sector level. When the number of defective cells in a sector exceeds a predetermined number, the sector containing the defective cells is replaced by a substitute sector.

An important feature of the invention allows defective cells or defective sectors to be remapped as soon as they are detected thereby enabling error correction codes to adequately rectify the relatively few errors that may crop up in the system.

According to yet another aspect of the present invention, a write cache is used to minimize the number of writes to the Flash EEprom memory. In this way the Flash EEprom memory will be subject to fewer stress inducing write/erase cycles, thereby retarding its aging. The most active data files are written to the cache memory instead of the Flash EEprom memory. Only when the activity levels have reduced to a predetermined level are the data files written from the cache memory to the Flash EEprom memory. Another advantage of the invention is the increase in write throughput by virtue of the faster cache memory.

According to yet another aspect of the present invention, one or more printed circuit cards are provided which contain controller and EEprom circuit chips for use in a computer system memory for long term, non-volatile storage, in place of a hard disk system, and which incorporate various of the other aspects of this invention alone and in combination.

The present invention also includes improvements in EEprom array read and write circuits and techniques in order to provide multiple threshold levels that allow accurate reading and writing of more than two distinct states within each memory cell over an extended lifetime of the memory cells, so that more than one bit may be reliably stored in each cell.

According to one aspect of the present invention, the multiple threshold breakpoint levels are provided by a set of memory cells which serves as master reference cells. The master reference cells are independently and externally programmable, either by the memory manufacturer or the user. This feature provides maximum flexibility, allowing the breakpoint thresholds to be individually set within the threshold window of the device at any time. Also, by virtue of being an identical device as that of the memory cells, the reference cells closely track the same variations due to manufacturing processes, operating conditions and device aging. The independent programmability of each breakpoint threshold level allows optimization and fine-tuning of the threshold window's partitioning, critical in multi-state implementation. Furthermore, it allows post-manufacture configuration for either 2-state or multi-state memory from the same device, depending on user need or device characteristics at the time.

According to another aspect of the present invention, a set of memory cells within each sector (where a sector is a group of memory cells which are all erased at the same time in a Flash EEprom) are set aside as local reference cells. Each set of reference cells tracks the Flash cells in the same sector closely as they are both cycled through the same number of program/erase cycles. Thus, the aging that occurs in the memory cells of a sector after a large number of erase/reprogram cycles is also reflected in the local reference cells. Each time the sector of flash cells is erased and reprogrammed, the set of individual breakpoint threshold levels are re-programmed to the associated local reference cells. The threshold levels read from the local reference cells then automatically adjust to changing conditions of the memory cells of the same sector. The threshold window's partitioning is thus optimally maintained. This technique is also useful for a memory that employs only a single reference cell that is used to read two state (1 bit) memory cells.

According to another aspect of the present invention, the threshold levels rewritten at each cycle to the local reference cells are obtained from a set of master cells which are not cycled along with the memory cells but rather which retain a charge that has been externally programmed (or reprogrammed). Only a single set of master memory cells is needed for an entire memory integrated circuit.

In one embodiment, the read operation directly uses the threshold levels in the local reference cells previously copied from the master reference cells. In another embodiment, the read operation indirectly uses the threshold levels in the local reference cells even though the reading is done relative to the master reference cells. It does this by first reading the local reference cells relative to the master reference cells. The differences detected are used to offset subsequent regular readings of memory cells relative to the master reference cells so that the biased readings are effectively relative to the local reference cells.

According to another aspect of the present invention, the program and verify operations are performed on a chunk (i.e. several bytes) of addressed cells at a time. Furthermore, the verify operation is performed by circuits on the EEprom chip. This avoids delays in shipping data off chip serially for verification in between each programming step.

According to another aspect of the present invention, where a programmed state is obtained by repetitive steps of programming and verifying from the "erased" state, a circuit verifies the programmed state after each programming step with the intended state and selectively inhibits further programming of any cells in the chunk that have been verified to have been programmed correctly. This enables efficient parallel programming of a chunk of data in a multi-state implementation.

According to another aspect of the present invention, where a chunk of EEprom cells are addressed to be erased in parallel, an erased state is obtained by repetitive steps of erasing and verifying from the existing state to the "erased" state, a circuit verifies the erased state after each erasing step with the "erased" state and selectively inhibits further erasing of any cells in the chunk that have been verified to have been erased correctly. This prevents over-erasing which is stressful to the device and enables efficient parallel erasing of a group of cells.

According to another aspect of the present invention, after a group of cells have been erased to the "erased" state, the cells are re-programmed to the state adjacent the "erased" state. This ensures that each erased cell starts from a well defined state, and also allows each cell to undergo similar program/erase stress.

According to another aspect of the present invention, the voltage supplied to the control gates of the EEprom cells is variable over a wide range and independent of the voltage supplied to the read circuits. This allows accurate program/erase margining as well as use in testing and diagnostics.

Additional objects, features, and advantages of the present invention will be understood from the following description of its preferred embodiments, which description should be taken in conjunction with the accompanying drawings.

BRIEF DESCRIPTION OF THE DRAWINGS

FIG. 1A is a general micrprocessor system including the Flash EEprom memory system of the present invention;

FIG. 1B is schematic block diagram illustrating a system including a number of Flash EEprom memory chips and a controller chip;

FIG. 2 is a schematic illustration of a system of Flash EEprom chips, among which memory sectors are selected to be erased;

FIG. 3A is a block circuit diagram (in the controller) for implementing selective multiple sector erase according to the preferred embodiment;

FIG. 3B shows details of a typical register used to select a sector for erase as shown in FIG. 2A;

FIG. 4 is a flow diagram illustrating the erase sequence of selective multiple sector erase;

FIG. 5 is a schematic illustration showing the partitioning of a Flash EEprom sector into a data area and a spare redundant area;

FIG. 6 is a circuit block diagram illustrating the data path control during read operation using the defect mapping scheme of the preferred embodiment;

FIG. 7 is a circuit block diagram illustrating the data path control during the write operation using the defect mapping scheme of the preferred embodiment;

FIG. 8 is a block diagram illustrating the write cache circuit inside the controller;

FIG. 9 is a cross-sectional view of an EEprom device integrated circuit structure that can be used to implement the various aspects of the present invention;

FIG. 10 is a view of the structure of FIG. 9 taken across section 2—2 thereof;

FIG. 11 is an equivalent circuit of a single EEprom cell of the type illustrated in FIGS. 9 and 10;

FIG. 12 shows an addressable array of EEprom cells;

FIG. 13 is a block diagram of an EEprom system in which the various aspects of the present invention are implemented;

FIG. 14 illustrates the partitioning of the threshold window of an EEprom cell which stores one bit of data;

FIG. 15A illustrates the partitioning of the threshold window of an EEprom cell which stores two bits of data;

FIG. 15B illustrates the partitioning of the source-drain conduction current threshold window of the EEprom cell of FIG. 15A;

FIGS. 16A and 16B are curves that illustrate the changes and characteristics of a typical EEprom after a period of use;

FIG. 17A illustrates read and program circuits for a master reference cell and an addressed memory cell according to the present invention;

FIG. 17B illustrates multi-state read circuits with reference cells according to the present invention;

FIGS. 17C(1)–17C(8) illustrate the timing for multi-state read for the circuits of FIG. 17B;

FIG. 18 illustrates a specific memory organization according to the present invention;

FIG. 19 shows an algorithm for programming a set of local reference cells according to the present invention;

FIG. 20A shows one embodiment of a read circuit using local reference cells directly;

FIG. 20B shows a read algorithm for the embodiment of FIG. 20A;

FIG. 21A shows an alternative embodiment of a read circuit using local reference cells indirectly;

FIG. 21B is a programmable circuit for the biased reading of the master reference cells according to the alternative embodiment;

FIG. 21C is a detail circuit diagram for the programmable biasing circuit of FIG. 21B;

FIG. 21D shows a read algorithm for the embodiment of FIG. 21A;

FIG. 22 illustrates the read/program data paths for a chunk of cells in parallel;

FIG. 23 shows an on chip program/verify algorithm according to the present invention;

FIG. 24 is a circuit diagram for the compare circuit according to the present invention;

FIG. 25 is a circuit diagram for the program circuit with inhibit according to the present invention; and FIGS. 26 and 27 are tables that list typical examples of operating voltages for the EEprom cell of the present invention.

DESCRIPTION OF THE PREFERRED EMBODIMENTS

EEprom System

A computer system in which the various aspects of the present invention are incorporated is illustrated generally in FIG. 1A. A typical computer system architecture includes a microprocessor 21 connected to a system bus 23, along with random access, main system memory 25, and at least one or more input-output devices 27, such as a keyboard, monitor, modem, and the like. Another main computer system component that is connected to a typical computer system bus 23 is a large amount of long-term, non-volatile memory 29. Typically, such a memory is a disk drive with a capacity of tens of megabytes of data storage. This data is retrieved into the system volatile memory 25 for use in current processing, and can be easily supplemented, changed or altered.

One aspect of the present invention is the substitution of a specific type of semiconductor memory system for the disk drive but without having to sacrifice non-volatility, ease of erasing and rewriting data into the memory, speed of access, low cost and reliability. This is accomplished by employing an array of electrically erasable programmable read only memories (EEprom's) integrated circuit chips. This type of memory has additional advantages of requiring less power to operate, and of being lighter in weight than a hard disk drive magnetic media memory, thereby being especially suited for battery operated portable computers.

The bulk storage memory 29 is constructed of a memory controller 31, connected to the computer system bus 23, and an array 33 of EEprom integrated circuit chips. Data and instructions are communicated from the controller 31 to the EEprom array 33 primarily over a serial data line 35. Similarly, data and status signals are communicated from the EEprom 33 to the controller 31 over serial data lines 37. Other control and status circuits between the controller 31 and the EEprom array 33 are not shown in FIG. 1A.

Referring to FIG. 1B, the controller 31 is preferably formed primarily on a single integrated circuit chip. It is connected to the system address and data bus 39, part of the system bus 33, as well as being connected to system control lines 41, which include interrupt, read, write and other usual computer system control lines.

The EEprom array 33 includes a number of EEprom integrated circuit chips 43, 45, 47, etc. Each includes a respective chip select and enable line 49, 51 and 53 from interface circuits 40. The interface circuits 40 also act to interface between the serial data lines 35, 37 and a circuit 55. Memory location addresses and data being written into or read from the EEprom chips 43, 45, 47, etc. are communicated from a bus 55, through logic and register circuits 57 and thence by another bus 59 to each of the memory chips 43, 45, 47 etc.

The bulk storage memory 29 of FIGS. 1A and 1B can be implemented on a single printed circuit card for moderate memory sizes. The various lines of the system buses 39 and 41 of FIG. 1B are terminated in connecting pins of such a card for connection with the rest of the computer system through a connector. Also connected to the card and its components are various standard power supply voltages (not shown).

For large amounts of memory, that which is conveniently provided by a single array 33 may not be enough. In such a case, additional EEprom arrays can be connected to the serial data lines 35 and 37 of the controller chip 31, as indicated in FIG. 1B. This is preferably all done on a single printed circuit card but if space is not sufficient to do this, then one or more EEprom arrays may be implemented on a second printed circuit card that is physically mounted onto the first and connected to a common controller chip 31.

Erase of Memory Structures

In system designs that store data in files or blocks the data will need to be periodically updated with revised or new information. It may also be desirable to overwrite some no longer needed information, in order to accommodate additional information. In a Flash EEprom memory, the memory cells must first be erased before information is placed in them. That is, a write (or program) operation is always preceded by an erase operation.

In conventional Flash erase memory devices, the erase operation is done in one of several ways. For example, in some devices such as the Intel corporation's model 27F-256 CMOS Flash EEprom, the entire chip is erased at one time. If not all the information in the chip is to be erased, the information must first be temporarily saved, and is usually written into another memory (typically RAM). The information is then restored into the nonvolatile Flash erase memory by programming back into the device. This is very slow and requires extra memory as holding space.

In other devices such as Seeq Technology Incorporated's model 48512 Flash EEprom chip, the memory is divided into blocks (or sectors) that are each separately erasable, but only one at a time. By selecting the desired sector and going through the erase sequence the designated area is erased. While, the need for temporary memory is reduced, erase in various areas of the memory still requires a time consuming sequential approach.

In the present invention, the Flash EEprom memory is divided into sectors where all cells within each sector are erasable together. Each sector can be addressed separately and selected for erase. One important feature is the ability to select any combination of sectors for erase together. This will allow for a much faster system erase than by doing each one independently as in prior art.

FIG. 2 illustrates schematically selected multiple sectors for erase. A Flash EEprom system includes one or more Flash EEprom chips such as 201, 203, 205. They are in communication with a controller 31 through lines 209. Typically, the controller 31 is itself in communication with a microprocessor system (not shown). The memory in each Flash EEprom chip is partitioned into sectors where all memory cells within a sector are erasable together. For example, each sector may have 512 byte (i.e. 512×8 cells) available to the user, and a chip may have 1024 sectors. Each sector is individually addressable, and may be selected, such as sectors 211, 213, 215, 217 in a multiple sector erase. As illustrated in FIG. 2, the selected sectors may be confined to one EEprom chip or be distributed among several chips in a system. The sectors that were selected will all be erased together. This capability will allow the memory and system of the present invention to operate much faster than the prior art architectures.

FIG. 3A illustrates a block diagram circuit 220 on a Flash EEprom chip (such as the chip 201 of FIG. 2) with which one or more sectors such as 211, 213 are selected (or deselected) for erase. Essentially, each sector such as 211, 213 is selected or tagged by setting the state of an erase enable register such as 221, 223 associated with the respective sectors. The selection and subsequent erase operations are performed under the control of the controller 31 (see FIG. 2). The circuit 220 is in communication with the controller 31 through lines 209. Command information from the controller is captured in the circuit 220 by a command register 225 through a serial interface 227. It is then decoded by a command decoder 229 which outputs various control signals. Similarly, address information is captured by an address register 231 and is decoded by an address decoder 233.

For example, in order to select the sector 211 for erase, the controller sends the address of the sector 211 to the circuit 220. The address is decoded in line 235 and is used in combination with a set erase enable signal in bus 237 to set an output 239 of the register 221 to HIGH. This enables the sector 211 in a subsequent erase operation. Similarly, if the sector 213 is also desired to be erased, its associated register 223 may be set HIGH.

FIG. 3B shows the structure of the register such as 221, 223 in more detail. The erase enable register 221 is a SET/RESET latch. Its set input 241 is obtained from the set erase enable signal in bus 237 gated by the address decode in line 235. Similarly, the reset input 243 is obtained from the clear erase enable signal in bus 237 gated by the address decode in line 235. In this way, when the set erase enable signal or the clear erase enable signal is issued to all the sectors, the signal is effective only on the sector that is being addressed.

After all sectors intended for erase have been selected, the controller then issues to the circuit 220, as well as all other chips in the system a global erase command in line 251 along with the high voltage for erasing in line 209. The device will then erase all the sectors that have been selected (i.e. the sectors 211 and 213) at one time. In addition to erasing the desired sectors within a chip, the architecture of the present system permits selection of sectors across various chips for simultaneous erase.

FIGS. 4(1)–4(11) illustrate the algorithm used in conjunction with the circuit 220 of FIG. 3A. In FIG. 4(1), the controller will shift the address into the circuit 220 which is decoded in the line to the erase enable register associated with the sector that is to be erased. In FIG. 4(2), the controller shifts in a command that is decoded to a set erase enable command which is used to latch the address decode signal onto the erase enable register for the addressed sector. This tags the sector for subsequent erase. In FIG. 4(3), if more sectors are to be tagged, the operations described relative to FIGS. 4(1)–4(2) are repeated until all sectors intended for erase have been tagged. After all sectors intended for erase have been tagged, the controller initiates an erase cycle as illustrated in FIG. 4(4).

Optimized erase implementations have been disclosed in two copending U.S. patent applications. They are copending U.S. patent applications, Ser. No. 204,175, filed Jun. 8, 1988, by Dr. Eliyahou Harari, now U.S. Pat. No. 5,095,344, and one entitled "Multi-State EEprom Read and Write Circuits and Techniques," Ser. No. 07/337,579, filed Apr. 13, 1989, now abandoned, by Sanjay Mehrotra and Dr. Eliyahou Harari. The disclosures of the two applications are hereby incorporate by reference. The Flash EEprom cells are erased by applying a pulse of erasing voltage followed by a read to verify if the cells are erased to the "erased" state. If not, further pulsing and verifying are repeated until the cells are verified to be erased. By erasing in this controlled manner, the cells are not subject to over-erasure which tends to age the EEprom device prematurely as well as make the cells harder to program.

As the group of selected sectors is going through the erase cycle, some sectors will reach the "erase" state earlier than others. Another important feature of the present invention is the ability to remove those sectors that have been verified to be erased from the group of selected sectors, thereby preventing them from over-erasing.

Returning to FIG. 4(4), after all sectors intended for erase have been tagged, the controller initiates an erase cycle to erase the group of tagged sectors. In FIG. 4(5), the controller shifts in a global command called Enable Erase into each Flash EEprom chip that is to perform an erase. This is followed in FIG. 4(5) by the controller raising of the erase voltage line (Ve) to a specified value for a specified duration. The controller will lower this voltage at the end of the erase duration time. In FIG. 4(6), the controller will then do a read verify sequence on the sectors selected for erase. In FIG. 4(7), if none of the sectors are verified, the sequences illustrated in FIGS. 4(5)–4(7) are repeated. In FIGS. 4(8) and 3(9), if one or more sectors are verified to be erased, they are taken out of the sequence. Referring also to FIG. 3A, this is achieved by having the controller address each of the verified sectors and clear the associated erase enable registers back to a LOW with a clear enable command in bus 237.

The sequences illustrated in FIGS. 4(5)–4(10) are repeated until all the sectors in the group are verified to be erased in FIG. 4(11). At the completion of the erase cycle, the controller will shift in a No Operation (NOP) command and the global Enable Erase command will be withdrawn as a protection against a false erasure.

The ability to select which sectors to erase and which ones not to, as well as which ones to stop erasing is advantageous. It will allow sectors that have erased before the slower erased sectors to be removed from the erase sequence so no further stress on the device will occur. This will increase the reliability of the system. Additional advantage is that if a sector is bad or is not used for some reason, that sector can be skipped over with no erase occurring within that sector. For example, if a sector is defective and have shorts in it, it may consume much power. A significant system advantage is gained by the present invention which allows it to be skipped on erase cycles so that it may greatly reduce the power required to erase the chip.

Another consideration in having the ability to pick the sectors to be erased within a device is the power savings to the system. The flexibility in erase configuration of the present invention enables the adaptation of the erase needs to the power capability of the system. This can be done by configuring the systems to be erased differently by software on a fixed basis between different systems. It also will allow the controller to adaptively change the amount of erasing being done by monitoring the voltage level in a system, such as a laptop computer.

An additional performance capability of the system in the present invention is the ability to issue a reset command to a Flash EEprom chip which will clear all erase enable latches and will prevent any further erase cycles from occurring. This is illustrated in FIGS. 2A and 2B by the reset signal in the line 261. By doing this in a global way to all the chips, less time will be taken to reset all the erase enable registers.

An additional performance capability is to have the ability to do erase operations without regard to chip select. Once an erase is started in some of the memory chips, the controller in the system can access other memory chips and do read and write operations on them. In addition, the device(s) doing the erase can be selected and have an address loaded for the next command following the erase.

Defect Mapping

Physical defects in memory devices give rise to hard errors. Data becomes corrupted whenever it is stored in the defective cells. In conventional memory devices such as RAM's and Disks, any physical defects arising from the manufacturing process are corrected at the factory. In RAM's, spare redundant memory cells on chip may be patched on, in place of the defective cells. In the traditional disk drive, the medium is imperfect and susceptible to defects. To overcome this problem manufacturers have devised various methods of operating with these defects present, the most usual being defect mapping of sectors. In a normal disk system the media is divided into cylinders and sectors. The sector being the basic unit in which data is stored. When a system is partitioned into the various sectors the sectors containing the defects are identified and are marked as bad and not to be used by the system. This is done in several ways. A defect map table is stored on a particular portion of the disk to be used by the interfacing controller. In addition, the bad sectors are marked as bad by special ID and flag markers. When the defect is addressed, the data that would normally be stored there is placed in an alternative location. The requirement for alternative sectors makes the system assign spare sectors at some specific interval or location. This reduces the amount of memory capacity and is a performance issue in how the alternative sectors are located.

One important application of the present invention is to replace a conventional disk storage device with a system incorporating an array of Flash EEprom memory chips. The EEprom system is preferably set up to emulate a conventional disk, and may be regarded as a "solid-state disk".

In a "disk" system made from such solid-state memory devices, low cost considerations necessitate efficient handling of defects. Another important feature of the invention enables the error correction scheme to conserve as much memory as possible. Essentially, it calls for the defective cells to be remapped cell by cell rather than by throwing away the whole sector (512 bytes typically) whenever a defect occurs in it. This scheme is especially suited to the Flash EEprom medium since the majority of errors will be bit errors rather than a long stream of adjacent defects as is typical in traditional disk medium.

In both cases of the prior art RAM and magnetic disk, once the device is shipped from the factory, there is little or no provision for replacing hard errors resulting from physical defects that appear later during normal operation. Error corrections then mainly rely on schemes using error correction codes (ECC).

The nature of the Flash EEprom device predicates a higher rate of cell failure especially with increasing program/erase cycling. The hard errors that accumulate with use would eventually overwhelm the ECC and render the device unusable. One important feature of the present invention is the ability for the system to correct for hard errors whenever they occur. Defective cells are detected by their failure to program or erase correctly. Also during read operation, defective cells are detected and located by the ECC. As soon as a defective cell is identified, the controller will apply defect mapping to replace the defective cell with a space cell located usually within the same sector. This dynamic correction of hard errors, in addition to conventional error correction schemes, significantly prolongs the life of the device.

Another feature of the present invention is an adaptive approach to error correction. Error correction code (ECC) is employed at all times to correct for soft errors as well as any hard errors that may arise. As soon as a hard error is detected, defect mapping is used to replace the defective cell with a spare cell in the same sector block. Only when the number of defective cells in a sector exceeds the defect mapping's capacity for that specific sector will the whole sector be replaced as in a conventional disk system. This scheme minimized wastage without compromising reliability.

FIG. 5 illustrates the memory architecture for the cell remapping scheme. As described before, the Flash EEprom memory is organized into sectors where the cells in each sector are erasable together. The memory architecture has a typical sector 401 organized into a data portion 403 and a spare (or shadow) portion 405. The data portion 403 is memory space available to the user. The spare portion 405 is further organized into an alternative defects data area 407, a defect map area 409, a header area 411 and an ECC and others area 413. These areas contain information that could be used by the controller to handle the defects and other overhead information such as headers and ECC.

Whenever a defective cell is detected in the sector, a good cell in the alternative defects data area 407 is assigned to backup the data designated for the defective cell. Thus even if the defective cell stores the data incorrectly, an error-free copy is stored in the backup cell. The addresses of the defective cell and the backup cell are stored as defect pointers in the defect map 409.

It is to be understood that the partitioning between the user data portion 403 and the spare portion 405 need not be rigid. The relative size of the various partitioned areas may be logically reassigned. Also the grouping of the various areas is largely for the purpose of discussion and not necessarily physically so. For example, the alternative defects data area 407 has been schematically grouped under the spare portion 405 to express the point that the space it occupies is no longer available to the user.

In a read operation, the controller first reads the header, the defect map and the alternative defects data. It then reads the actual data. It keeps track of defective cells and the location of the substitute data by means of the defect map. Whenever a defective cell is encountered, the controller substitutes its bad data with the good data from the alternative defects.

FIG. 6 illustrates the read data path control in the preferred embodiment. A memory device 33 which may include a plurality of Flash EEprom chips is under the control of the controller 31. The controller 31 is itself part of a microcomputer system under the control of a microprocessor (not shown). To initiate the reading of a sector, the microprocessor loads a memory address generator 503 in the controller with a memory address for starting the read operation. This information is loaded through a microprocessor interface port 505. Then the microprocessor loads a DMA controller 507 with the starting location in buffer memory or bus address that the data read should be sent. Then the microprocessor loads the header information (Head, Cylinder and sector) into a holding register file 509. Finally, the microprocessor loads a command sequencer 511 with a read command before passing control to the controller 31.

After assuming control, the controller 31 first addresses the header of the sector and verifies that the memory is accessed at the address that the user had specified. This is achieved by the following sequence. The controller selects a memory chip (chip select) among the memory device 33 and shifts the address for the header area from the address generator 503 out to the selected memory chip in the memory device 33. The controller then switches the multiplexer 513 and shifts also the read command out to the memory device 33. Then the memory device reads the address sent it and begins sending serial data from the addressed sector back to the controller. A receiver 515 in the controller receives this data and puts it in parallel format. In one embodiment, once a byte (8 bits) is compiled, the controller compares the received data against the header data previously stored by the microprocessor in the holding register file 509. If the compare is correct, the proper location is verified and the sequence continues.

Next the controller 31 reads the defect pointers and loads these bad address locations into the holding register file 509. This is followed by the controller reading the alternative defects data that were written to replace the bad bits as they were written. The alternative bits are stored in an alternative defects data file 517 that will be accessed as the data bits are read.

Once the Header has been determined to be a match and the defect pointers and alternative bits have been loaded, the controller begins to shift out the address of the lowest address of the desired sector to be read. The data from the sector in the memory device 33 is then shifted into the controller chip 31. The receiver 515 converts the data to a parallel format and transfers each byte into a temporary holding FIFO 519 to be shipped out of the controller.

A pipeline architecture is employed to provide efficient throughput as the data is gated through the controller from the receiver 515 to the FIFO 519. As each data bit is received from memory the controller is comparing the address of the data being sent (stored in the address generator 507) against the defect pointer map (stored in the register file 509). If the address is determined to be a bad location, by a match at the output of the comparator 521, the bad bit from the memory received by the receiver 515 is replaced by the good bit for that location. The good bit is obtained from the alternative defects data file 517. This is done by switching the multiplexer 523 to receive the good bit from the alternative defects data file instead of the bad bit from the receiver 515, as the data is sent to the FIFO 519. Once the corrected data is in the FIFO it is ready to be sent to buffer memory or system memory (not shown). The data is sent from the controller's FIFO 519 to the system memory by the controller's DMA controller 507. This controller 507 then requests and gets access to the system bus and puts out an address and gates the data via an output interface 525 out to the system bus. This is done as each byte gets loaded into the FIFO 519. As the corrected data is loaded into the FIFO it will also be gated into an ECC hardware 527 where the data file will be acted on by the ECC.

Thus in the manner described, the data read from the memory device 33 is gated through the controller 31 to be sent to the system. This process continues until the last bit of addressed data has been transferred.

In spite of defect mapping of previously detected defective cells, new hard errors might occur since the last mapping. As the dynamic defect mapping constantly "puts away" new defective cells, the latest hard error that may arise between defect mapping would be adequately handled by the ECC. As the data is gated through the controller 31, the controller is gating the ECC bits into the ECC hardware 527 to determine if the stored value matched the just calculated remainder value. If it matches then the data transferred out to the system memory was good and the read operation was completed. However, if the ECC registers an error then a correction calculation on the data sent to system memory is performed and the corrected data retransmitted. The method for calculating the error can be done in hardware or software by conventional methods. The ECC is also able to calculate and locate the defective cell causing the error. This may be used by the controller 31 to update the defect map associated with the sector in which the defective cell is detected. In this manner, hard errors are constantly removed from the Flash EEprom system.

FIG. 7 illustrates the write data path control in the preferred embodiment. The first portion of a write sequence is similar to a read sequence described previously. The microprocessor first loads the Address pointers for the memory device 33 and the DMA as in the read sequence. It also loads the header desired into the address generator 503 and the command queue into the command sequencer 511. The command queue is loaded with a read header command first. Thereafter, control is passed over to the controller 31. The controller then gates the address and command to the memory device 33, as in the read sequence. The memory device returns header data through controller's receiver 515. The controller compares the received header data to the expected value (stored in the holding register file 509). If the compare is correct, the proper location is verified and the sequence continues. Then the controller loads the defective address pointers from the memory device 33 into the holding register file 509 and the alternative data into the alternative defects data file 517.

Next, the controller begins to fetch the write data from system memory (not shown). It does this by getting access to the system bus, outputs the memory or bus address and does the read cycle. It pulls the data into a FIFO 601 through an input interface 603. The controller then shifts the starting sector address (lowest byte address) from the address generator 503 to the selected memory device 33. This is followed by data from the FIFO 601. These data are routed through multiplexers 605 and 513 and converted to serial format before being sent to the memory device 33. This sequence continues until all bytes for a write cycle have been loaded into the selected memory.

A pipeline architecture is employed to provide efficient throughput as the data is gated from the FIFO 601 to the selected memory 33. The data gated out of the FIFO 601 is sent to the ECC hardware 527 where a remainder value will be calculated within the ECC. In the next stage, as the data is being sent to the memory device through multiplexers 605 and 513, the comparator 521 is comparing its address from the address generator 503 to the defect pointer address values in the holding register file 509. When a match occurs, indicating that a defective location is about to be written, the controller saves this bit into the alternative defect data file 517. At the same time, all bad bits sent to memory will be sent as zeroes.

After the bytes for a write cycle have been loaded into the selected memory device, the controller issues a program command to the memory device and initiate a write cycle. Optimized implementations of write operation for Flash EEprom device have been disclosed in two previously cited co-pending U.S. patent applications, Ser. No. 204,175, now U.S. Pat. No. 5,095,344 and one entitled "Multi-State EEprom Read and Write Circuits and Techniques, Ser. No. 07/337,579, filed Apr. 13, 1989, now abandoned." Relevant portions of the disclosures are hereby incorporated by reference. Briefly, during the write cycle, the controller applies a pulse of programming (or writing) voltages. This is followed by a verify read to determine if all the bits have been programmed properly. If the bits did not verify, the controller repeats the program/verify cycle until all bits are correctly programmed.

If a bit fails to verify after prolonged program/verify cycling, the controller will designate that bit as defective and update the defect map accordingly. The updating is done dynamically, as soon as the defective cell is detected. Similar actions are taken in the case of failure in erase verify.

After all the bits have been programmed and verified, the controller loads the next data bits from the FIFO 601 and addresses the next location in the addressed sector. It then performs another program/verify sequence on the next set of bytes. The sequence continues until the end of the data for that sector. Once this has occurred, the controller addresses the shadow memory (header area) associated with the sector (see FIG. 5) and writes the contents of the ECC registers into this area.

In addition, the collection of bits that was flagged as defective and were saved in the alternative defects data file 516 is then written in memory at the alternative defects data locations (see FIG. 5), thereby saving the good bit values to be used on a subsequent read. Once these data groups are written and verified, the sector write is considered completed.

The present invention also has provision for defect mapping of the whole sector, but only after the number of defective cells in the sector has exceeded the cell defect mapping's capacity for that specific sector. A count is kept of the number of defective cells in each sector. When the number in a sector exceeds a predetermined value, the controller marks that sector as defective and maps it to another sector. The defect pointer for the linked sectors may be stored in a sector defect map. The sector defect map may be located in the original defective sector if its spare area is sufficiently defect-free. However, when the data area of the sector has accumulated a large number of defects, it is quite likely that the spare area will also be full of defects.

Thus, it is preferable in another embodiment to locate the sector map in another memory maintained by the controller. The memory may be located in the controller hardware or be part of the Flash EEprom memory. When the controller is given an address to access data, the controller compares this address against the sector defect map. If a match occurs then access to the defective sector is denied and the substitute address present in the defect map is entered, and the corresponding substitute sector is accessed instead.

In yet another embodiment, the sector remapping is performed by the microprocessor. The microprocessor looks at the incoming address and compares it against the sector defect map. If a match occurs, it does not issue the command to the controller but instead substitute the alternative location as the new command.

Apart from the much higher speed of the solid-state disk, another advantage is the lack of mechanical parts. The long seek times, rotational latency inherent in disk drives are not present. In addition, the long synchronization times, sync mark detects and write gaps are not required. Thus the overhead needed for accessing the location where data is to be read or written is much less. All of these simplifications and lack of constraints result in a much faster system with much reduced overheads. In addition, the files can be arranged in memory in any address order desired, only requiring the controller to know how to get at the data as needed.

Another feature of the invention is that defect mapping is implemented without the need to interrupt the data stream transferred to or from the sector. The data in a block which may contain errors are transferred regardless, and is corrected afterwards. Preserving the sequential addressing will result in higher speed by itself. Further, it allows the implementation of an efficient pipeline architecture in the read and write data paths.

Write Cache System

Cache memory is generally used to speed up the performance of systems having slower access devices For example in a computer system, access of data from disk storage is slow and the speed would be greatly improved if the data could be obtained from the much faster RAM. Typically a part of system RAM is used as a cache for temporarily holding the most recently accessed data from disk. The next time the data is needed, it may be obtained from the fast cache instead of the slow disk. The scheme works well in situations where the same data is repeatedly operated on. This is the case in most structures and programs since the computer tends to work within a small area of memory at a time in running a program. Another example of caching is the using of faster SRAM cache to speed up access of data normally stored in cheaper but slower DRAM.

Most of the conventional cache designs are read caches for speeding up reads from memory. In some cases, write caches are used for speeding up writes to memory. However in the case of writes to system memory (e.g. disks), data is still being written to system memory directly every time they occur, while being written into cache at the same time.

This is done because of concern for loss of updated data files in case of power loss. If the write data is only stored in the cache memory (volatile) a loss of power will result in the new updated files being lost from cache before having the old data updated in system memory (non-volatile). The system will then be operating on the old data when these files are used in further processing. The need to write to main memory every time defeats the caching mechanism for writes. Read caching does not have this concern since the data that could be lost from cache has a backup on disk.

In the present invention, a system of Flash EEprom is used to provide non-volatile memory in place of traditional system memories such as disk storage. However, Flash EEprom memory is subject to wearing out by excessive program/erase cycles. Even with the improved Flash EEprom memory device as disclosed in co-pending U.S. patent applications, Ser. No. 204,175, now U.S. Pat. No. 5,095,244, and one intitled "multi-state EEprom Read and Write Circuits and Techniques," by sanjay Mehrotra and Dr. Eliyahou Harari, Ser. No. 07/337,579, filed Apr. 13, 1989, now abandoned, the endurance limit is approximately $10^6$ program/erase cycles. In a ten-year projected life time of the device, this translates to a limit of one program/erase cycle per 5 minutes. This may be marginal in normal computer usage.

To overcome this problem, a cache memory is used in a novel way to insulate the Flash EEprom memory device from enduring too many program/erase cycles. The primary function of the cache is to act on writes to the Flash EEprom memory and not on reads of the Flash EEprom memory, unlike the case with traditional caches. Instead of writing to the Flash EEprom memory every time the data is updated, the data may be operated on several times in the cache before being committed to the Flash EEprom memory. This reduces the number of writes to the Flash EEprom memory. Also, by writing mostly into the faster cache memory and reducing the number of writes to the slower Flash EEprom, an additional benefit is the increase in system write throughput.

A relatively small size cache memory is quite effective to implement the present invention. This helps to overcome the problem of data loss in the volatile cache memory during a power loss. In that event, it is relatively easy to have sufficient power reserve to maintain the cache memory long enough and have the data dumped into a non-volatile memory such as a specially reserved space in the Flash EEprom memory. In the event of a power down or and power loss to the system, the write cache system may be isolated from the system and a dedicated rechargeable power supply may be switch in only to power the cache system and the reserved space in the Flash EEprom memory.

FIG. 8 illustrates schematically a cache system 701 as part of the controller, according to the present invention. On one hand the cache system 701 is connected to the Flash EEprom memory array 33. On the other hand it is connected to the microprocessor system (not shown) through a host interface 703. The cache system 701 has two memories. One is a cache memory 705 for temporarily holding write data files. The other is a tag memory 709 for storing relevant information about the data files held in the cache memory 705 A memory timing/control circuit 713 controls the writing of data files from the cache memory 705 to the Flash EEprom memory 33. The memory control circuit 713 is responsive to the information stored in the tag memory as well as a power sensing input 715 with is connected through the host interface 703 via a line 717 to the power supply of the microprocessor system. A power loss in the microprocessor system will be sensed by the memory control circuit 713 which will then down load all the data files in the volatile cache memory 705 to the non-volatile Flash EEprom memory 33.

In the present invention, the Flash EEprom memory array 33 is organized into sectors (typically 512 byte size) such that all memory cells within each sector are erasable together. Thus each sector may be considered to store a data file and a write operation on the memory array acts on one or more such files.

During read of a new sector in the Flash EEprom memory 33, the data file is read out and sent directly to the host through the controller. This file is not used to fill the cache memory 705 as is done in the traditional cache systems.

After the host system has processed the data within a file and wishes to write it back to the Flash EEprom memory 33, it accesses the cache system 701 with a write cycle request. The controller then intercepts this request and acts on the cycle.

In one embodiment of the invention, the data file is written to the cache memory 705. At the same time, two other pieces of information about the data file are written to a tag memory 709. The first is a file pointer which identifies the file present in the cache memory 705. The second is a time stamp that tells what time the file was last written into the cache memory. In this way, each time the host wishes to write to the Flash EEprom memory 33, the data file is actually first stored in the cache memory 705 along with pointers and time stamps in the tag memory 709.

In another embodiment of the invention, when a write from the host occurs, the controller first checks to see if that file already existed in the cache memory 705 or has been tagged in the tag memory 709. If it has not been tagged, the file is written to the Flash memory 33, while its identifier and time stamp are written to the tag memory 709. If the file already is present in the cache memory or has been tagged, it is updated in the cache memory and not written to the Flash memory. In this way only infrequently used data files are written into the Flash memory while frequently used data files are trapped in the cache memory.

In yet another embodiment of the invention, when a write from the host occurs, the controller first checks to see if that data file has been last written anywhere within a predetermined period of time (for example, 5 minutes). If it has not, the data file is written to the Flash memory 33, while its identifier and time stamp are written to the tag memory 709. If the data file has been last written within the predetermined period of time, it is written into the cache memory 705 and not written to the Flash memory. At the same time, its identifier and time stamp are written to the tag memory 709 as in the other embodiments. In this way also, only infrequently used data files are written into the Flash memory while frequently used data files are trapped in the cache memory.

In all embodiments, over time the cache memory 705 will start to fill up. When the controller has detected that some predetermined state of fullness has been reached, it begins to archive preferentially some files over others in the cache memory 705 by writing them to the Flash memory 33.

In either embodiments, over time the cache memory 705 will start to fill up. When the controller has detected that some predetermined state of fullness has been reached, it begins to archive preferentially some files over others in the cache memory 705 by writing them to the Flash memory 33. The file identifier tag bits for these files are then reset, indicating that these files may be written over. This makes room for new data files entering the cache memory.

The controller is responsible for first moving the least active files back into the Flash memory 33 to make room for new active files. To keep track of each file's activity level, the time stamp for each file is incremented by the controller at every time step unless reset by a new activity of the file. The timing is provided by timers 711. At every time step (count), the controller systematically accesses each data file in the cache memory and reads the last time stamp written for this data file. The controller then increments the time stamp by another time step (i.e. increments the count by one).

Two things can happen to a file's time stamp, depending on the activity of the file. One possibility is for the time stamp to be reset in the event of a new activity occurring. The other possibility is that no new activity occurs for the file and the time stamp continues to increment until the file is removed from the cache. In practice a maximum limit may be reached if the time stamp is allowed to increase indefinitely. For example, the system may allow the time stamp to increment to a maximum period of inactivity of 5 minutes. Thus, when a data file is written in the cache memory, the time stamp for the file is set at its initial value. Then the time stamp will start to age, incrementing at every time step unless reset to its initial value again by another write update. After say, 5 minutes of inactivity, the time stamp has incremented to a maximum terminal count.

In one embodiment of keeping count, a bit can be shifted one place in a shift register each time a count increment for a file occurs. If the file is updated (a new activity has occurred) the bit's location will be reset to the initial location of the shift register. On the other hand, if the file remains inactive the bit will eventually be shifted to the terminal shift position. In another embodiment, a count value for each file is stored and incremented at each time step. After each increment, the count value is compared to a master counter, the difference being the time delay in question.

Thus, if a file is active its incremented time stamp is reset back to the initial value each time the data file is rewritten. In this manner, files that are constantly updated will have low time stamp identifiers and will be kept in cache until their activity decreases. After a period of inactivity has expired, they acquire the maximum time stamp identifiers. The inactive files are eventually archived to the Flash memory freeing space in the cache memory for new, more active files. Space is also freed up in the tag memory when these inactive files are moved to the Flash memory.

At any time when room must be made available for new data files coming into the cache memory, the controller removes some of the older files and archives them to the Flash memory 33. Scheduling is done by a memory timing/control circuit 713 in the controller. The decision to archive the file is based on several criteria. The controller looks at the frequency of writes occurring in the system and looks at how full the cache is. If there is still room in the cache, no archiving need to be done. If more room is needed, the files with the earliest time stamps are first removed and archived to the Flash memory.

Although the invention has been described with implementation in hardware in the controller, it is to be understood that other implementations are possible. For example, the cache system may be located elsewhere in the system, or be implemented by software using the existing microprocessor system. Such variations are within the scope of protection for the present invention.

The Profile of how often data is written back to the Flash memory is determined by several factors. It depends on the size of the cache memory and the frequency of writes occurring in the system. With a small cache memory system, only the highest frequency files will be cached. Less frequently accessed files will also be cached with increasing cache memory size. In the present invention, a relatively cheap and small amount of cache memory, preferably about 1 Mbyte, may be used to good advantage. By not constantly writing the most active files (the top 5%), the write frequency of the Flash EEprom may be reduced from the usual one every millisecond to one every 5 minutes. In this way the wear-out time for the memory can be extended almost indefinitely. This improvement is also accompanied by increased system performance during write.

Incorporating time tag into the write cache concept has the advantage that the size of the write cache buffer memory can be relatively small, since it is used only to store frequently written data files, with all other files written directly into the Flash EEprom memory. A second advantage is that the management of moving data files in and out of the write cache buffer can be automated since it does not require advanced knowledge of which data files are to be called next.

The various aspects of the present invention that have been described co-operate in a system of Flash EEprom memory array to make the Flash EEprom memory a viable alternative to conventional non-volatile mass storage devices.

There are many specific Eprom, EEprom semiconductor integrated circuit structures that can be utilized in making a memory array with which the various aspects of the present invention are advantageously implemented.

"Split-Channel" EEprom Cell

A preferred EEprom structure is generally illustrated in the integrated circuit cross-sectional views of FIGS. 9 and 10. Describing this preferred structure briefly, two memory cells 1011 and 1013 are formed on a lightly p-doped substrate 1015. A heavily n-doped implanted region 1017 between the cells 1011 and 1013 serves as a drain for the cell 1011 and a source for the cell 1013. Similarly, another implanted n-doped region 1019 is the source of the cell 1011 and the drain of an adjacent cell, and similarly for another n-doped region 1021.

Each of the memory cells 1011 and 1013 contains respective conductive floating gates 1023 and 1025, generally made of polysilicon material. Each of these floating gates is surrounded by dielectric material so as to be insulated from each other and any other conductive elements of the structure. A control gate 1027 extends across both of the cells 1011 and 1013 in a manner to be insulated from the floating gates and the substrate itself. As shown in FIG. 10, conductive strips 1029 and 1031 are additionally provided to be insulated from each other and other conductive elements of the structure, serving as erase gates. A pair of such erase gates surrounds the floating gate of each memory cell and are separated from it by an erase dielectric layer. The cells are isolated by thick field oxide regions, such as regions 1033, 1035, and 1037, shown in the cross-section of FIG. 9, and regions 1039 and 1041 shown in the view of FIG. 10.

The memory cell is programmed by transferring electrons from the substrate 1015 to a floating gate, such as the floating gate 1025 of the memory cell 1013. The charge on the floating gate 1025 is increased by electrons travelling across the dielectric from a heavily p-doped region 1043 and onto the floating gate. Charge is removed from the floating gate through the dielectric between it and the erase gates 1029 and 1031. This preferred EEprom structure, and a process for manufacturing it, are described in detail in copending patent application Ser. No. 323,779 of Jack H. Yuan and Eliyahou Harari, filed Mar. 15, 1989, which is expressly incorporated herein by reference.

The EEprom structure illustrated in FIGS. 9 and 10 is a "split-channel" type. Each cell may be viewed as a composite transistor consisting of two transistor T1 and T2 in series as shown in FIG. 11. The T1 transistor 1011a is formed along the length L1 of the channel of the cell 1011 of FIG. 9. It has a variable threshold voltage $V_{T1}$. In series with the T1 transistor 1011a is the T2 transistor 1011b that is formed in a portion of the channel L2. It has a fixed threshold voltage $VT_2$ of about 1 V. Elements of the equivalent circuit of FIG. 11 are labeled with the same reference numbers as used for corresponding parts in FIGS. 9 and 10, with a prime (') added.

As can best be seen from the equivalent circuit of FIG. 11, the level of charge on the T1's floating gate 1023' of an EEprom cell affects the threshold voltage $V_{T1}$ of the T1 transistor 1011a when operated with the control gate 1027'. Thus, a number of memory states may be defined in a cell, corresponding to well defined threshold voltages programmed into the cell by an appropriate amount of charge placed on the floating gate. The programming is performed by applying, over a certain period of time, appropriate voltages to the cell's control gate 1027' as well as drain 1017' and source 1019'.

Addressable Flash EEprom Array

The various aspects of the present invention are typically applied to an array of Flash EEprom cells in an integrated circuit chip. FIG. 12 illustrates schematically an array of individually addressable EEprom cells 1060. Each cell is equivalent to the one shown in FIG. 11, having a control gate, source and drain, and an erase gate. The plurality of individual memory cells are organized in rows and columns. Each cell is addressed by selectively energizing its row and column simultaneously. A column 1062, for example, includes a first memory cell 1063, an adjacent second memory cell 1065, and so forth. A second column 1072 includes memory cells 1073, 1075, and so forth. Cells 1063 and 1073 are located in a row 1076, cells 1065 and 1071 in another, adjacent row, and so forth.

Along each row, a word line is connected to all the control gates of the cells in the row. For example, the row 1076 has the word line 1077 and the next row has the word line 1079. A row decoder 1081 selectively connects the control gate voltage VCG on an input line 1083 to all the control gates along a selected word line for a row.

Along each column, all the cells have their sources connected by a source line such as 1091 and all their drains by a drain line such as 1093. Since the cells along a row are connected in series by their sources and drains, the drain of one cell is also the source of the adjacent cell. Thus, the line 1093 is the drain line for the column 1062 as well as the source line for the column 1072. A column decoder 1101 selectively connects the source voltage $V_S$ on an input line 1103 to all the sources and connects the drain voltage $V_D$ on an input line 1105 to all the drains along a selected column.

Each cell is addressed by the row and column in which it is located. For example, if the cell 1075 is addressed for programming or reading, appropriate programming or reading voltages must be supplied to the cell's control gate, source and drain. An address on the internal address bus 1111 is used to decode row decoder 1081 for connecting $V_{CG}$ to the word line 1079 connected to the control gate of the cell 1075. The same address is used to decode column decoder 1101 for connecting $V_S$ to the source line 1093 and $V_D$ to the drain line 1095, which are respectively connected to the source and drain of the cell 1075.

One aspect of the present invention, which will be disclosed in more detail in a later section, is the implementation of programming and reading of a plurality of memory cells in parallel. In order to select a plurality of columns simultaneously, the column decoder, in turn, controls the switching of a source multiplexer 1107 and a drain multiplexer 1109. In this way, the selected plurality of columns may have their source lines and drain lines made accessible for connection to $V_S$ and $V_D$ respectively.

Access to the erase gate of each cell is similar to that of the control gate. In one implementation, an erase line such as 1113 or 1115 or 1117 is connected to the erase gate of each cells in a row. An erase decoder 1119 decodes an address on the internal address bus 1111 and selectively connects the erase voltage $V_{EG}$ on input line 1121 to an erase line. This allows each row of cells to be addressed independently, such as the row 1076 being simultaneously (Flash) erased by proper voltages applied to their erase gates through erase line 1113. In this case, the Flash cell consists of one row of memory cells. However, other Flash cell's implementations are possible and most applications will provide for simultaneous erasing of many rows of cells at one time.

Flash EEprom System

The addressable EEprom array 1060 in FIG. 12 forms part of the larger multi-state Flash EEprom system of the present invention as illustrated in FIG. 13. In the larger system, an EEprom integrated circuit chip 1130 is controlled by a controller 1140 via an interface 1150. The controller 1140 is itself in communication with a central microprocessor unit 1160.

The EEprom chip 1130 comprises the addressable EEprom array 1060, a serial protocol logic 1170, local power control circuits 1180, and various programming and reading circuits 1190, 1200, 1210, 1220, 1230 and 1240.

The controller 1140 controls the functioning of the EEprom chip 1130 by supplying the appropriate voltages, controls and timing. Tables of FIGS. 26 and 27 show typical examples of voltage conditions for the various operational modes of the EEprom cell. The addressable EEprom array 1060 may be directly powered by the controller 1140 or, as shown in FIG. 13, be further regulated on chip by the local power control 1180. Control and data linkages between the controller 1140 and the chip 1130 are made through the serial in line 1251 and the serial out line 1253. Clock timing is provided by the controller via line 1255.

In a typical operation of the EEprom chip 1130, the controller 1140 will send a serial stream of signals to the chip 1130 via serial in line 1251. The signals, containing control, data, address and timing information, will be sorted out by the serial protocol logic 1170. In appropriate time sequence, the logic 1170 outputs various control signals 1257 to control the various circuits on the chip 1130. It also sends an address via the internal address bus 111 to connect the addressed cell to voltages put out from the controller. In the meantime, if the operation is programming, the data is staged for programming the addressed cell by being sent via a serial data line 1259 to a set of read/program latches and shift registers 1190.

Read Circuits and Techniques Using Reference Cells

To accurately and reliably determine the memory state of a cell is essential for EEprom operations. This is because all the basic functions such as read, erase verify and program verify depend on it. Improved and novel read circuits 1220 for the EEprom chip 1130 and techniques of the present invention make multi-state EEprom feasible.

As discussed in connection with FIG. 11, the programmed charge placed on the floating gate 1023' determines the programmed threshold voltage $V_{T1}$ of the cell. Generally, $V_{T1}$ increases or decreases with the amount of negative charge on the floating gate 1023'. The charge can even be reduced to a positive value (depletion mode) where $V_{T1}$ decreases below $VT_2$ and even becomes negative. The maximum and minimum values of $V_{T1}$ are governed by the dielectric strength of the device material. The span of $V_{T1}$ defines a threshold voltage window in which memory states may be implemented.

Copending patent application Ser. No. 204,175, now U.S. Pat. No. 5,095,344 discloses an EEprom cell with memory states defined within a maximized window of threshold voltage $V_{T1}$. The full threshold voltage window includes the negative region of the threshold voltage, in addition to the usual positive region. The increased window provides more memory space to implement multi-state in an EEprom cell.

FIGS. 14 and 15 respectively illustrate the manner in which the threshold voltage window is partitioned for a 2-state memory and a 4-state memory cell. (of course it is also possible to partition the window for a 3-state memory or even for a continuum of states in an analog, rather than digital memory).

Referring first to FIG. 14, the solid curve 1343 shows $V_{T1}$ as a function of programming time. The threshold voltage window is delimited by the minimum and maximum values of $V_{T1}$, represented approximately by the Erase state level 1345 and the Fully Program state level 1347 respectively. The 2-state memory is implemented by partitioning the window into two halves 1346, 1348 using a breakpoint threshold level 1349. Thus, the cell may be considered to be in memory state 0 (or state 1) if the cell is programmed with a $V_{T1}$ within region 1346 (or region 1348) respectively.

A typical erase/program cycle begins with erase which reduces the threshold voltage of the cell to its Erase state level 1345. Subsequent repetitive programming is used to increase the threshold voltage $V_{T1}$ to the desired level. Rather than continuously applying programming voltages to the addressed cell for some fixed period of time corresponding to the state to which the cell is to be programmed, it is preferable to apply programming voltages in repetitive short pulses with a read operation occurring after each pulse to determine when it has been programmed to the desired threshold voltage level, at which time the programming terminates. The programming voltages and duration of the pulses are such that the pulses advance $V_{T1}$ across the various regions rapidly but each pulse is sufficiently fine to not overshoot any of the regions. This minimizes voltage and field related stresses on the cell, and therefore improves its reliability.

FIG. 15A illustrates the 4-state case where the threshold voltage window is partitioned into four regions 1351, 1353, 1355, 1357 by breakpoint levels 1352, 1354, 1356 respectively. The cell is considered to be in state "3" or "2" or "1" or "0" if its $V_{T1}$ is programmed to be within corresponding regions 1351 or 1353 or 1355 or 1357 respectively. A 4-state cell is able to store two bits of data. Thus, the four states may be encoded as (1,1), (1,0), (0,1) and (0,0) respectively.

In general, if each EEprom cell is to store K states, the threshold window must be partitioned into K regions with at least K−1 threshold levels. Thus, only one breakpoint level is required for a 2-state memory cell, and three breakpoint levels are required for a 4-state cell.

In principle, a threshold voltage window may be partitioned to a large number of memory states. For example, for an EEprom device with a maximum threshold window of 16 V, it may be partitioned into thirty-two states each within an approximately half volt interval. In practice, prior art EEprom devices have only stored two states or one bit per cell with diminished reliability and life. Apart from operating with a smaller threshold window, prior devices fail to solve two other problems inherent in EEprom devices. Both problems relate to the uncertainty in the amount of charge in the floating gate and hence the uncertainty in the threshold voltage VT1 programmed into the cell.

The first problem has to do with the endurance-related stress the device suffers each time it goes through an erase/program cycle. The endurance of a Flash EEprom device is its ability to withstand a given number of program/erase cycles. The physical phenomenon limiting the endurance of prior art Flash EEprom devices is trapping of electrons in the active dielectric films of the device. During programming, electrons are injected from the substrate to the floating gate through a dielectric interface. Similarly, during erasing, electrons are extracted from the floating gate to the erase gate through a dielectric interface. In both cases, some of the electrons are trapped by the dielectric interface. The trapped electrons oppose the applied electric field in subsequent program/erase cycles thereby causing the programmed $V_{T1}$ to shift to a lower value and the erased $V_{T1}$ to shift to a higher value. This can be seen in a gradual closure in the voltage "window" between the "0" and "1" states of prior art devices as shown in FIG. 16A. Beyond approximately $1 \times 10^4$ program/erase cycles the window closure can become sufficiently severe to cause the reading circuitry to malfunction. If cycling is continued, the device eventually experiences catastrophic failure due to a ruptured dielectric. This typically occurs at between $1 \times 10^6$ and $1 \times 10^7$ cycles, and is known as the intrinsic breakdown of the device. In prior art EEprom devices the window closure is what limits the practical endurance to approximately $1 \times 10^4$ program/erase cycles. This problem is even more critical if multi-state memory is implemented, since more accurate placement of $V_{T1}$ is demanded.

A second problem has to do with the charge retention on the floating gate. The charge on the floating gate tends to diminish somewhat through leakage over a period of time. This causes the threshold voltage $V_{T1}$ to shift also to a lower value over time. FIG. 16B illustrates the reduction of $V_{T1}$ as a function of time. Over the life time of the device $V_{T1}$ may shift by as much as 1 V. In a multi-state device, this could shift the memory by one or two states.

The present invention overcomes these problems and presents circuits and techniques to reliably program and read the various states even in a multi-state implementation. The memory state of a cell may be determined by measuring the threshold voltage $V_{T1}$ programmed therein. Alternatively, as set forth in copending patent application, Ser. No. 204,175, now U.S. Pat. No. 5,094,344, the memory state may conveniently be determined by measuring the differing conduction in the source-drain current $I_{DS}$ for the different states. In the 4-state example, FIG. 15A shows the partition in the threshold voltage window. FIG. 15B, on the other hand, illustrates typical values of $I_{DS}$ (solid curves) for the four states as a function of the control gate voltage $V_{CG}$. With $V_{CG}$ at 5 V, the $I_{DS}$ values for each of the four conduction states can be distinguished by sensing with four corresponding current sensing amplifiers in parallel. Associated with each amplifier is a corresponding reference conduction states IREF level (shown as broken curves in FIG. 16). Just as the breakpoint threshold levels (see FIGS. 14 and 15A) are used to demarcate the different regions in the threshold voltage window, the $I_{REF}$ levels are used to do the same in the corresponding source-drain current window. By comparing with the $I_{REF}$'S. the conduction state of the memory cell can be determined. Co-pending patent application, Ser. No. 204,175 proposes using the same sensing amplifiers and $I_{REF}$'S for both programming and reading. This provides good tracking between the reference levels (broken curves in FIG. 15B) and the programmed levels (solid curves in FIG. 15B).

In the improved scheme of the present invention, the $I_{REF}$'S are themselves provided by the source-drain currents of a set of EEprom cells existing on the same chip and set aside solely for this purpose. Thus, they act as master reference cells with their $I_{REF}$'S used as reference levels for the reading and programming of all other EEprom cells on the same chip. By using the same device as the EEprom cells to act as reference cells, excellent tracking with respect to temperature, voltage and process variations is achieved. Furthermore, the charge retention problem, important in multi-state implementation, is alleviated.

Referring to FIG. 17A, one such master reference cell 1400 is shown with its program and read paths. The reference cells erase and program module 1410 serves to program or re-program each such reference cell 1400. The module 1410 includes program and erase circuits 1411 with a programming path 1413 connected to the drain of the master reference call 1400. The circuits 1411 are initiated by addresses decoded from the internal bus 1111 by a program decoder 1415 and an erase decoder 1417 respectively. Accordingly, programming voltages or erasing voltages are selectively supplied each reference cell such as cell 1400. In this way, the reference level in each reference cell may be independently set cr reprogrammed. Typically, the threshold level of each reference cell will be factory-programmed to the optimum level appropriate to each batch of chips produced. This. could be done by comparison with an external standard reference level. By software control, a user also has the option to reset the reference threshold levels.

Once the reference threshold voltage $V_{T1}$ or reference drain-source current $I_{REF}$ is programmed into each reference cell 1400, it then serves as a reference for the reading of an addressed memory cell such as cell 1420. The reference cell 1400 is connected to a first leg 1403 of a current sensing amplifier 1410 via a clocked switch 1413. A second leg 1415 of the amplifier is essentially connected to the addressed memory cell 1420 whose programmed conduction state is to be determined. When cell 1420 is to be read, a control signal READ will enable a switch 1421 so that the cell's drain is connected to the second leg 1415. The sense amplifier 1410 supplies voltage via $V_{CC}$ to the drains of both the master reference cell 1400 and the addressed cell 1420. In the preferred embodiment, the amplifier has a current mirror configuration such that any differential in currents through the two legs 1403 and 1415 results in the voltage in the second leg 1415 being pulled up towards $V_{CC}$ or down towards $V_S$. Thus, the node at the second leg 1415 is respectively HIGH (or LOW) when the source-drain current $I_{DS}$ for the addressed cell 1420 is less (or more) than $I_{REF}$ through the master reference cell 1400. At the appropriate time controlled by a clocked switch 1423, the sensed result at the second leg 1415 may be held by a latch 1425 and made available at an output line 1427. When $I_{DS}$ is less than $I_{REF}$, a HIGH appears at the output line 1427 and the addressed cell 1420 is regarded as in the same conduction state as the master reference cell 1400.

In the preferred embodiment, a voltage clamp and fast pull-up circuit 1430 is also inserted between the second leg 1415 and the drain 1431 of the addressed cell 1420. The circuit 1430 serves to keep the drain voltage VD at a maximum of 1.5 V–2.0 V when it is charging up in the case of lower $I_{DS}$. It also prevents $V_D$ from pulling too low in the case of higher $I_{DS}$.

In general, if each memory cell is to store K states, then at least K–1, or preferably K reference levels need be provided. In one embodiment, the addressed cell is compared to the K reference cells using k sense amplifiers in parallel. This is preferable for the 2-state case because of speed, but may spread the available current too thin for proper sensing in the multi-state case. Thus, for multi-state case, it is preferable to compare the addressed cell with the K reference cells one at a time in sequence.

FIG. 17B illustrates more explicitly the multi-state reading configuration. The K reference cells such as 1431, 1433, 1435 are connected to the sense amplifier 1440 via the amplifier's first leg 1441. The connection is time-multiplexed by clocked switches such as 1451, 1453, 1455 respectively. The second leg 1457 of the sense amplifier is connected to the addressed cell as in FIG. 17A. The sensed signal at the second leg 1457 is time-selectively latched by clocked switches such as 1461, 1463, 1465 onto such latches 1471, 1473, 1475.

FIGS. 17C(1)–17C(8) illustrate the timing for multistate read. When the signal READ goes HIGH, a switch 1421 is enabled and the addressed memory cell is connected to the second leg 1457 of the sense amplifier 1440 (FIG. 17C(1)). The clocks timing is given in FIGS. 17C(2)–17C(4). Thus, at each clock signal, the sense amplifier sequentially compares the addressed cell with each of the reference cells and latches each results. The latched outputs of the sense amplifier are given in FIGS. 17C(5)–17C(7). After all the K output states of the sense amplifier 1440 are latched, they are encoded by a K–L decoder 1480 ($2^L \geq K$) (FIG. 17C(8)) into L binary bits.

Thus, the multiple threshold levels are provided by a set of memory cells which serves as master reference cells. The master reference cells are independently and externally erasable and programmable, either by the device manufacturer or the user. This feature provides maximum flexibility, allowing the breakpoint thresholds to be individually set within the threshold window of the device at any time. By virtue of being the same device as that of the memory cells, the reference cells closely track the same variations due to manufacturing processes, operating conditions and charge retention problems. The independent programmability of each threshold level at will allows optimization and fine-tuning of the partitioning of the threshold window to make multi-state memory viable. Furthermore, it allows post-manufacture configuration for either 2-state or multi-state memory from the same device, depending on user need or device characteristics at the time.

Another important feature of the present invention serves to overcome the problems of endurance-related stress. As explained previously, the erase, program and read characteristics of each memory cell depends on the cumulated stress endured over the number of program/erase cycles the cell has been through. In general, the memory cells are subjected to many more program/erase cycles than the master reference cells. The initially optimized reference levels will eventually become misaligned to cause reading errors. The present underlying inventive concept is to have the reference levels also reflect the same cycling suffered by the memory cells. This is achieved by the implementation of local reference cells in addition to the master reference cells. The local reference cells are subjected to the same program/erase cycling as the memory cells. Every time after an erase operation, the reference levels in the master reference cells are re-copied into the corresponding set of local reference cells. Memory cells are then read with respect to the reference levels of the closely tracking local reference cells.

In this way, the deviation in cell characteristics after each program/erase cycle is automatically compensated for. The proper partitioning of the transforming threshold window is therefore maintained so that the memory states can be read correctly even after many cycles.

FIG. 18 illustrates the local cells referencing implementation for Flash EEprom. In the Flash EEprom array 1060 (FIG. 12), each group of memory cells which is collectively erased or programmed is called a sector. The term "Flash sector" is analogous to the term "sector" used in magnetic disk storage devices and they are used interchangeably here. The EEprom array is grouped into Flash sectors such as 1501, 1503 and 1505. While all memory cells in a Flash sector suffer the same cycling, different Flash sectors may undergo different cycling. In order to track each Flash sector properly, a set of memory cells in each Flash sector is set aside for use as local reference cells. For example, after the Flash sector 1503 has been erased, the reference levels in the master reference cells 1507 are re-programmed into the local reference cells associated with the Flash sector 1503. Until the next erase cycle, the read circuits 1513 will continue to read the memory cells within the Flash sector 1503 with respect to the re-programmed reference levels.

FIGS. 19(1)–19(7) illustrates the algorithm to reprogram a sector's reference cells. In particular, FIGS. 19(1)–19(3) relate to erasing the sector's local reference cells to their "erased states". Thus in FIG. 19(1), a pulse of erasing voltage is applied to all the sector's memory cells including the local reference cells. In FIG. 19(2), all the local reference cells are then read with respect to the master references cells to verify if they have all been erased to the "erased state". As long as one cell is found to be otherwise, another pulse of erasing voltage will be applied to all the cells. This process is repeated until all the local reference cells in the sector are verified to be in the "erased" state (FIG. 19(3)).

FIGS. 19(4)–19(7) relate to programming the local reference cells in the sector. After all the local reference cells in the sector have been verified to be in the "erased" state, a pulse of programming voltage is applied in FIG. 19(4) only to all the local reference cells. This is followed in FIG. 19(5) by reading the local reference cells with respect to the master reference cells to verify if every one of the local reference cells is programmed to the same state as the corresponding master reference cell. For those local reference cells not so verified, another pulse of programming voltage is selectively applied to them alone (FIG. 19(6)). This process is repeated until all the local reference cells are correctly verified (FIG. 19(7)) to be programmed to the various breakpoint threshold levels in the threshold window.

Once the local reference cells in the sector have been re-programmed, they are used directly or indirectly to erase verify, program verify or read the sector's addressed memory cells.

FIG. 20A illustrates one embodiment in which the local reference cells are used directly to read or program/erase verify the sector's memory cells. Thus, during those operations, a parallel pair of switches 1525 is enabled by a READ signal and the sense amplifier 1440 will read the sector's addressed memory cells 1523 with respect to each of the sector's local reference cells 1525. During program/erase verify of the local reference cells (as illustrated in FIG. 19), another parallel pair of switches 1527 enables reading of the local reference cells 1525 relative to the master reference cells 1529.

FIG. 20B illustrates the algorithm for using the local reference cells directly to read or program/erase verify the sector's addressed memory cells.

FIG. 21A illustrates an alternative embodiment in which the local reference cells are used indirectly to read the addressed memory cells. First the master reference cells are erased and programmed each to one of the desired multiple breakpoint thresholds within the threshold window. Using these master reference thresholds the local reference cells within an erased sector of cells are each programmed to one of the same desired multiple breakpoint thresholds. Next the addressed cells in the sector are programmed (written) with the desired data. The reading sequence for the addressed cells in the sector then involves the steps illustrated in FIG. 21A.

First each of the local reference cells 1525 is read relative to the corresponding master reference cell 1531. This is effected by an enabling READ I signal to a switch 1533 connecting the local reference cells 1525 to the second leg 1457 of the sense amplifier 1440 with the master reference 1531 connected to the first leg 1441 of the sense amplifier. Auxiliary current source circuits associated with each master reference cell are now used to optimally bias the current through the first leg 1441 of the sense amplifier to match the current in the second leg 1457. After the bias adjustment operation is completed for all breakpoint threshold levels the addressed cells in the sector are read relative to the bias-adjusted master reference cells. This is effected by disabling READ I to 1533 and enabling READ signal to switch 1535. The advantage of this approach is that any variations in $V_{CC}$, temperature, cycling fatigue or other effects which may, over time, cause threshold deviations between the master reference cells and the addressed cells is eliminated prior to reading, since the local reference cells (which track threshold deviations of the addressed cells) are used to effectively readjust the breakpoint thresholds of the master reference cells. For example, this scheme permits programming of the addressed cells when the master reference cells are powered with $V_{CC}$=5.5 V and subsequently reading the addressed cells with the master reference cells powered at $V_{CC}$=4.5 V. The difference of 1 volt in $V_{CC}$, which would normally cause a change in the value of the breakpoint thresholds, is neutralized by using the local reference cells to bias adjust the master reference cells to counteract this change at the time of reading.

FIGS. 21B and 21C show in more detail one embodiment of the current biasing circuits such as 1541, 1543, 1545 for the master reference cells 1551, 1553, 1555. Each biasing circuit acts as a current shunt for the current in the master reference cell. For example, the circuit 1541 is tapped to the drain of the master reference cell 1551 through the line 1561. It modifies the current in line 1562 to the sense amplifier (first leg) either by sourcing current from $V_{CC}$ or draining current to $V_{SS}$. In the former case, the current in the line 1562 is reduced, and otherwise for the latter case. As biasing is being established for the master reference 1551, any inequality in the currents in the two legs of the sense amplifier can be communicated to outside the chip. This is detected by the controller (see FIG. 13) which in turn programs the biasing circuit 1541 via the internal address bus 1111 to subtract or add current in the line 1562 in order to equalize that of the local reference.

FIG. 21C illustrates an embodiment of the biasing circuit such as the circuit 1541. A bank of parallel transistors such as 1571, 1573, 1575 are all connected with their drains to $V_{CC}$, and their sources via switches such as 1581, 1583, 1585 to the line 1561. By selectively enabling the switches, different number of transistors may be used to subtract various amount of current from line 1562. Similarly, another bank of parallel transistors such as 1591, 1593, 1595 are all connected with their sources to $V_{SS}$, and their drains via switches such as 1601, 1603, 1605 to the line 1561. By selectively enabling the switches, a different number of transistors may be used to add a various amount of current to line 1562. A decoder 1609 is used to decode address from the internal address bus 1111 to selectively enable the switches. The enabling signals are stored in latches 1611, 1613. In this way every time a sector is read, the master reference cells are re-biased relative to the local reference cells, and used for reading the memory cells in the sector.

FIGS. 21D(1)–21D(4) illustrate the read algorithm for the alternative embodiment. The sector must previously have had its local reference cells programmed and verified relative to the master reference cells (FIG. 21D(1)). Accordingly, each of the master reference cells is then read relative to the local reference cells (FIG. 21D(2)). The master reference cells are biased to equalize the current to that of the corresponding local reference cells (FIG. 21D(3)). Subsequently, the memory cells in the sector are read relative to the biased master reference cells(FIG. 21D(4)).

The read circuits and operation described are also employed in the programming and erasing of the memory cells, particularly in the verifying part of the operation. As described previously, programming is performed in small steps, with reading of the state programmed in between to verify if the desired state has been reached. As soon as the programmed state is verified correctly, programming stops. Similarly, erasing is performed in small steps, with reading of the state of erase in between to verify if the "erased" state has been reach. Once the "erased" state is verified correctly, erasing stops.

As described previously, only K−1 breakpoint threshold levels are required to partition the threshold window into K regions, thereby allowing the memory cell to store K states. According to one aspect of the present invention, however, in the multi-state case where the threshold window is more finely partitioned, it is preferable to use K threshold levels for K state. The extra threshold level is used to distinguish the "erased" state from the state with the lowest threshold level. This prevents over-erasing and thus over-stressing the cell since erasing will stop once the "erased" state is reached. The selective inhibition of individual cells for erase does not apply to the Flash EEprom case where at least a sector must be erased each time. It is suitable for those EEprom arrays where the memory cells can be individually addressed for erase.

According to another feature of the invention, after a memory cell has been erased to the "erased" state, it is programmed slightly to bring the cell to the state with the lowest threshold level (ground state) adjacent the "erased" state. This has two advantages. First, the threshold levels of the ground state of all the memory cells, being confined between the same two breakpoint threshold levels, are well-defined and not widely scattered. This provide an uniform starting point for subsequent programming of the cells. Secondly, all cells get some programming, thereby preventing those cells which tend to have the ground state stored in them, for example, from losing track with the rest with regard to program/erase cycling and endurance history.

On Chip Program Verify

As mentioned before, programming of an EEprom cell to a desired state is preferably performed in small steps starting from the "erase" state. After each programming step, the cell under programming is read to verify if the desired state has been reached. If it has not, further programming and verifying will be repeated until it is so verified.

Referring to the system diagram illustrated in FIG. 13, the EEprom chip 1130 is under the control of the controller 1140. They are linked serially by the serial in line 1251 and serial out line 1253. In prior art EEprom devices, after each programming step, the state attained in the cell under programming is read and sent back to the controller 1140 or the CPU 1160 for verification with the desired state. This scheme places a heavy penalty on speed especially in view of the serial link.

In the present invention, the program verification is optimized by programming a chunk (typically several bytes) of cells in parallel followed by verifying in parallel and on chip. The parallel programming is implemented by a selective programming circuit which disables programming of those cells in the chunk whose states have already been verified correctly. This feature is essential in a multi-state implementation, because some cells will reach their desired state earlier than others, and will continue past the desired state if not stopped. After the whole chunk of cells have been verified correctly, logic on chip communicates this fact to the controller, whereby programming of the next chunk of cells may commence. In this way, in between each programming step data does not need to be shuttled between the EEprom chip and the controller, and program verification speed is greatly enhanced.

FIG. 22 illustrates the program and verify paths for a chunk of n cells in parallel. The same numerals are used for corresponding modules in the system diagram of FIG. 13. The EEprom array 1060 is addressed by N cells at a time. For example, N may be 64 cells wide. In a 512 bytes Flash sector, consisting of 4 rows of 1024 cells, there will be 64 chunks of 64 cells. The source multiplexer 1107 selectively connects the N sources of one addressed chunk of cells to the source voltage $V_S$ in line 1103. Similarly, the drain multiplexer 1109 selectively makes the N drains of the chunk accessible through an N-channel data path 1105. The data path 1105 is accessed by the program circuit with inhibit 1210 during programming and by read circuits 1220 during reading, program verifying or erase verifying.

Referring again to the system diagram in FIG. 13, programming is under the control of the controller 1140. The data to be programmed into the sector is sent chunk by chunk. The controller first sends a first chunk of N*L serial data bits together with addresses, control and timing information to the EEprom chip 1130. L is the number of binary bits encoded per memory cell. For example, L=1 for a 2-state cell, and L=2 for a 4-state cell. Thus if N=64 and L=2, the chunk of data bits will be 128 bits wide. The N*L data bits are stored in latches and shift registers 1190 where the serial bits are converted to N*L parallel bits. These data will be required for program verify in conjunction with the read circuits 1220, bit decoder 1230, compare circuit 1200 and the program circuit with inhibit 1210.

The program algorithm for a chunk of N cells is best described by referring to both the system diagram of FIG. 13 and FIGS. 23(1)–23(7) which illustrate the algorithm itself. As mentioned in an earlier section, prior to programming the sector, the whole sector must be erased and all cells in it verified to be in the "erased" state (FIG. 23(1)). This is followed in FIG. 23(2) by programming the sector local reference cells (as shown in FIGS. 19(1)–(3)). In FIG. 23(3), the N*L bits of parallel data is latched in latches 1190. In FIG. 23(4), the read circuits 1220 access the N-channel data path 1105 to read the states in the N chunk of cells. The read algorithm has already been described in conjunction with FIG. 20B or FIG. 21D. The N-cell reads generates N*K (K=number of states per cell) output states. These are decoded by bit decoder 1230 into N*L binary bits. In FIG. 23(5), the N*L read bits are compared bit by bit with the N*L program data bits from latches 1190 by compare circuit 1200. In FIG. 23(6), if any read bit fails to compare with the program data bit, a further programming voltage pulse from the program circuit 1210 is applied simultaneously to the chunk of cells. However, an inhibit circuit within the program circuit 1210 selectively blocks programming to those cells whose bits are correctly verified with the programmed data bits. Thus, only the unverified cells are programmed each time. Programming and verification are repeated until all the cells are correctly verified in FIG. 23(7).

FIG. 24 shows one embodiment of the compare circuit 1200 of FIG. 13 in more detail. The circuit 1200 comprises N cell compare modules such as 1701, 1703, one for each of the N cells in the chunk. In each cell compare module such as the module 1701, the L read bits (L=number of binary bits encoded for each cell) are compared bit by bit with the corresponding program data bits. This is performed by L XOR gates such as 1711, 1713, 1715. The output of these XOR gates pass through an NOR gate 1717 such that a "1" appears at the output of NOR gate 1717 whenever all the L bits are verified, and a "0" appears when otherwise. When the control signal VERIFY is true, this result is latched to a latch 1721 such that the same result at the output of NOR gate 1717 is available at the cell compare module's output 1725. The compare circuit 1200 performs the comparisons of L bits in parallel. The N compare module's outputs such as 1725, 1727 are available at an N-channel output line 1731 to be fed to the program circuit with inhibit 1210 of FIG. 13.

At the same time, the N outputs such as 1725, 1727 are passed through an AND gate 1733 so that its single output 1735 results in a "1" when all N cells are verified and a "0" when otherwise. Referring also to FIG. 13, the single output 1735 is used to signal the controller 1140 that all N cells in the chunk of data have been correctly verified. The signal in output 1735 is sent through the serial out line 1253 via AND gate 1240 during a VERIFY operation.

At power-up or at the end of program/verify of a chunk of data, all cell compare module's outputs such as 1725, 1727 are reset to the "not-verified" state of "0". This is achieved by pulling the node 1726 to $V_{SS}$ (0 V) by means of the RESET signal in line 1727 to a transistor 1729.

FIG. 25 shows one embodiment of the program circuit with inhibit 1210 of FIG. 13 in more detail. The program circuit 1210 comprises N program with inhibit modules such as 1801, 1803. As illustrated in the tables of FIGS. 26 and 27, in order to program the N cells, a voltage $V_{PD}$ must be applied to each of the N cells' drain and a voltage $V_{PG}$ applied to the control gates. Each program module such as 1801 serves to selectively pass $V_{PD}$ on a line 1805 to one of the drains through the one of the N-channel data path 1105. Since $V_{PD}$ is typically about 8 V to 9 V which is higher than $V_{CC}$, the latter cannot be used to turn on the transistor switch 1807. Rather the higher voltage $V_{CG}$ (about 12 V) is used to enable switch 1807. $V_{CG}$ in line 1801 is itself enabled by an AND gate when both the program control signal PGM in line 1813 is true and the signal in line 1731 is a "0". Since the signal in line 1731 is from the output of the cell compare module 1701 shown in FIG. 24, it follows that $V_{PD}$ will be selectively passed onto those cells which are not yet verified. In this way, every time a programming pulse is applied, it is only applied to those cells which have not yet reached their intended states. This selective programming feature is especially necessary in implementing parallel programming and on chip verification in the multi-state case.

Variable Control of Voltage to the Control Gate

The system diagram of FIG. 13 in conjunction with FIGS. 26 and 27 illustrate how various voltages are applied to the EEprom array 1060 to perform the basic functions of the EEprom. Prior art EEprom devices only allow the voltage supplied to the control gate $V_{CG}$ to assume one of two voltages, namely $V_{CC}$ or the higher programming voltage of about 12 V.

In another aspect of the present invention, the voltage supplied to the control gate $V_{CG}$ is allowed to be independently and continuously variable over a wide range of voltages. This is provided by $V_{PG}$ from the controller 1140. In particular $V_{CG}$ in a line 1083 is fed from $V_{PG}$ which is in turn supplied by the controller from a line 1901. FIG. 27 shows $V_{PG}$ to assume various voltages under different functions of the EEprom.

The variability of $V_{CG}$ is particularly advantageous in program and erase margining schemes. In program margining, the read during program verify is done with $V_{CG}$ at a slightly higher voltage than the standard $V_{CC}$. This helps to place the programmed threshold well into the state by programming past the breakpoint threshold level with a slight margin. In erase verify, the cell is verified with a somewhat reduced $V_{CG}$ to put the cell well into the "erased" state. Furthermore, margining can be used to offset the charge retention problem described earlier (FIG. 16B).

As mentioned before, prior art EEproms typically employ $V_{CC}$ to feed $V_{CG}$ during program or erase verify. In order to do margining, $V_{CC}$ itself needs to be ramped up or reduced. This practice produces inaccurate results in the reading circuits since they are also driven by $V_{CC}$.

In the present invention, the variability of $V_{CG}$ independent of voltages supplied to the reading circuit produce more accurate and reliable results.

Furthermore, the wide range of $V_{CG}$ is useful during testing and diagnostic of the EEprom. It allows the full range of the programmed cell's threshold to be measured easily by continuing to increase $V_{CG}$ (up to the maximum limited by the device's junction breakdown).

While the embodiments of the various aspects of the present invention that have been described are the preferred implementation, those skilled in the art will understand that variations thereof may also be possible. Therefore, the invention is entitled to protection within the full scope of the appended claims

We claim:

1. A method of operating an EEprom system having memory cells that individually include an electrically floating gate carrying a charge level that is alterable in response to appropriate voltage conditions being applied to the cell in order to set a variable threshold level thereof into a range that is determinable by reading the cell, said method comprising:

applying said appropriate voltage conditions in parallel to a plurality of said memory cells, thereby to alter the charge levels on the floating gates of said plurality of memory cells, determining the threshold level ranges in which individual ones of said plurality of memory cells lie, and terminating said application of appropriate voltage conditions to individual ones of said plurality of memory cells upon their being determined to have reached desired threshold level ranges while continuing to apply said appropriate voltage conditions to others of said plurality of cells until all of the plurality of cells are determined to have reached their desired threshold level ranges.

2. The method of claim 1, wherein there are exactly two threshold level ranges.

3. The method of claim 1, wherein there are more than two threshold level ranges.

4. The method of claim 1, wherein the threshold level ranges are separated by exactly one breakpoint threshold level, thereby to provide exactly two non-overlapping threshold level ranges.

5. The method of claim 1, wherein the threshold level ranges are separated by more than one breakpoint threshold level, thereby to provide more than two non-overlapping threshold level ranges.

6. The method of claim 1, wherein said desired threshold level ranges include an erased threshold level range.

7. The method of claim 1, wherein the array of memory cells are grouped into blocks of cells wherein the threshold levels of cells within a selected one of the blocks are changed together to a single given threshold level range prior to applying said appropriate voltage conditions in parallel to the plurality of cells within said one block.

8. The method of claim 7, wherein individual ones of said blocks include a specific number of memory cells and said plurality of memory cells to which said appropriate voltage conditions are applied in parallel are less than said specific number, and additionally comprising repeating for another plurality of cells within said one block said applying, determining and terminating operations.

9. The method of claim 7, wherein individual ones of the blocks of cells contain a number of spare cells, and further wherein the spare cells within a particular block are substituted in place of any defective cells within said plurality of cells of said particular block.

10. The method of any one of claims 1–9, carried out on a single integrated circuit chip.

11. The method of claim 1, wherein the array of memory cells are grouped into blocks of cells wherein the threshold levels of cells within individual ones of the blocks are changed together to a single given threshold level range prior to applying said appropriate voltage conditions in parallel to the plurality of cells within one of the blocks, the method further comprising simultaneously changing the threshold levels of cells within a selected two or more blocks to said given level range.

12. The method of claim 1 wherein the desired ones of said threshold level ranges reached by applying appropriate voltage conditions to the plurality of memory cells correspond to a chunk of input data being programmed into the memory system.

13. The method of claim 12, wherein the plurality of cells are determined to have reached the desired threshold level ranges by comparing the threshold levels of the plurality of cells with the chunk of input data.

14. The method of claim 13, wherein the chunk of input data is stored in a cache memory prior to being programmed into memory cells within the EEprom.

15. The method of claim 5, wherein the appropriate voltage conditions are applied to said plurality of memory cells in successive applications of said voltage pulses that individually shift the threshold level of the cells to which the voltage pulses are applied less than one half of a difference between adjacent ones of the breakpoint levels.

16. The method of either of claims 3 or 5, wherein terminating the application of appropriate voltage conditions to individual ones of the plurality of memory cells occurs upon their being determined to have been programmed to within the desired threshold levels by a margin.

17. The method of any one of claims 1, 2 or 4, wherein individual ones of the plurality of memory cells are determined to have reached their desired threshold level ranges by comparison with at least one reference level stored in at least one of the memory cells.

18. The method of either of claims 3 or 5, wherein individual ones of the plurality of memory cells are determined to have reached their desired threshold level ranges by comparison with two or more reference levels stored in two or more of the memory cells.

19. An electrically erasable and programmable read only memory system, comprising:

an array of electrically alterable memory cells that individually include a field effect transistor having a floating gate and a threshold level that is variable in accordance with an amount of charge carried by the floating gate, said array being divided into blocks of cells that are resettable together, cells within said blocks being addressable for application of programming voltage conditions to individually program them into one of more than two distinct threshold level ranges corresponding to more than one bit of input data per cell, a reset circuit that simultaneously applies reset voltage conditions to the cells within individual blocks to drive the effective threshold levels of such cells to a reset state, a programming circuit that applies the programming voltage conditions to a plurality of addressed cells within a reset block to drive the effective threshold voltage of the addressed cells toward one of the more than two programmable threshold level ranges, a reading circuit that monitors in parallel the threshold level ranges of the plurality of addressed cells, and a control circuit that individually terminates application of the programming voltage conditions to any one of the plurality of addressed cells when the reading circuit verifies that said any one cell has reached the programmable threshold level range that corresponds to the input data being stored therein, while enabling further application of the programming voltage conditions to others of the plurality of addressed cells that have not yet been so verified, until all of the plurality of addressed cells are verified.

20. The memory system according to claim 18, wherein the plurality of addressed cells are less than a number of cells within the individual blocks.

21. The memory system according to claim 19, wherein the control circuit includes a plurality of latches and means for setting individual ones of the latches in response to corresponding ones of said plurality of addressed cells being verified.

22. The memory system according to claim 19, wherein said more than two distinct threshold level ranges are non-overlapping and separated from each other by two or more breakpoint threshold levels.

23. The memory system according to claim 22, wherein the reading circuit includes means for ascertaining the individual threshold level ranges of the plurality of memory cells after the cells have been programmed into the individual threshold level ranges beyond one of their breakpoints by a margin.

24. The memory system according to claim 19, wherein the programming circuit causes the plurality of addressed cells to be programmed with successive applications of said programming voltage conditions, and the reading circuit operates to monitor the threshold level ranges of the plurality of addressed cells in between applications of said programming voltage conditions.

25. The memory system according to claim 24, wherein the programming circuit further shifts the threshold levels of the individual addressed cells by less than one half of a difference between at least two breakpoint threshold levels defining one of the threshold level ranges.

26. The memory system according to claim 24, wherein the programming circuit further operates with programming voltage conditions that requires a plurality of said successive applications of programming voltage conditions in order to change individual ones of the plurality of addressed cells from one of the threshold level ranges to another adjacent threshold level range.

27. The memory system according to claim 19, wherein the control circuit includes a comparator receiving the monitored threshold level range of the plurality of addressed cells and the input data being programmed into the plurality of addressed cells for verifying when the individual ones of the plurality of cells reach the programmable threshold level that corresponds to the input data being stored therein.

28. The memory system according to claim 19, wherein at least one reference cell is included in individual ones of the blocks of cells, and which additionally comprises means for programming said at least one reference cell to a reference level, and wherein said reading circuit includes means for reading the reference level of the reference cell of the block wherein the plurality of addressed cells exists to verify that any one cell has reached the desired threshold level range.

29. The memory system according to claim 19, wherein the reset circuit includes means operable after application of the reset voltage conditions to an addressed at least one block for adjusting to the reset state any cells of said at least one block that were overerased by the reset voltage condition application.

30. The memory system according to claim 19, wherein the reset circuit includes means for selecting one or more of the blocks for erase, and means responsive to the selection means for simultaneously applying the reset voltage condition to the memory cells within all of the selected blocks.

31. The memory system according to claim 30, wherein the block selecting means includes a register associated with individual ones of the blocks for containing an indication whether the associated block is to be erased.

32. A method of storing multiple bits of binary data in a chunk of non-volatile memory cells which individually have more than two programmable states, comprising:

applying electrical programming parameters in parallel to cells within said chunk, monitoring the states of individual cells within said chunk, and terminating application of programming parameters to individual cells within said chunk when they are monitored to have reached desired ones of said more than two programmable states corresponding to the multiple bits of data being stored, while continuing to apply said programming parameters to others of the cells within said chunk, until all of the cells within said chunk are determined to have reached their programmable states corresponding to the multiple bits of data being stored.

33. The method of claim 32, wherein, prior to applying electrical programming parameters to cells within said chunk, at least the cells within said chunk are all reset to a common state different than any of said more than two programmable states.

34. The method of claim 32, wherein, prior to applying electrical programming parameters to the cells wherein said chunk, at least the cells within said chunk are all reset to one of the more than two programmable states.

35. The method of claim 34, wherein resetting at least the cells within said chunk includes initially driving at least all of the cells within said chunk to a common state different than any of said more than two programmable states, and then programming all of at least the cells within said chunk from the common state into one of the more than two programmable states by the following:

applying electrical programming parameters in parallel to at least the cells within said chunk, monitoring the states in which at least the cells within said chunk are individually programmed, and terminating application of programming parameters to individual ones of at least the cells within said chunk when they are monitored to have reached said one of the more than two programmable states while continuing to apply said programming parameters to others of the cells within said chunk until all of the cells within said chunk are determined to have reached the said one of the more than two programmable states.

36. An electrically erasable and programmable non-volatile memory system, comprising:

an integrated circuit array of electrically alterable memory cells that are individually programmable into more than two states, thereby individually storing more than one bit of binary data, a programming circuit that applies appropriate programming parameters in parallel to an addressed plurality of cells, a reading circuit that verifies in parallel the state into which the addressed plurality of cells are programmed, means for inhibiting further programming of correctly verified cells among the plurality of addressed cells, and means for further programming and verifying in parallel the plurality of addressed cells and inhibiting programming of correctly verified cells until all the plurality of addressed cells are verified correctly.

37. A method of operating an EEprom system having memory cells that individually include an electrically floating gate carrying a charge level that is alterable in response to appropriate voltage conditions being applied to the cell in order to set a variable threshold thereof to a desired level that is determinable by reading the cell, said method comprising:

applying said appropriate voltage conditions in parallel to a plurality of said memory cells, thereby to alter the charge levels on the floating gates of said plurality of memory cells to drive their threshold levels to desired levels, individually monitoring the threshold levels of said plurality of memory cells to set a binary element associated with each such cell, when reaching its desired threshold level, in order to prevent further application of appropriate voltage conditions to said plurality of memory cells from altering the charge level of the associated memory cell, and continuing the voltage applying and monitoring steps until all of said plurality of cells have reached their desired levels without allowing any individual binary element to be reset as a result of any monitoring its associated memory cell after the binary element is set.

38. The method of claim 37, wherein there are exactly two threshold levels.

39. The method of claim 37, wherein there are more than two threshold levels.

* * * * *